United States Patent
Lee et al.

(10) Patent No.: US 9,910,326 B2
(45) Date of Patent: Mar. 6, 2018

(54) LIQUID CRYSTAL DISPLAY DEVICE

(71) Applicant: Samsung Display Co. Ltd., Yongin-si (KR)

(72) Inventors: Ji Eun Lee, Seoul (KR); Sung Man Kim, Seongnam-si (KR); Won Ho Kim, Seongnam-si (KR); Tae Hyung Hwang, Seoul (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 15/191,612

(22) Filed: Jun. 24, 2016

(65) Prior Publication Data

US 2017/0160609 A1    Jun. 8, 2017

(30) Foreign Application Priority Data

Dec. 2, 2015   (KR) .......................... 10-2015-0170442

(51) Int. Cl.
*H01L 27/32*    (2006.01)
*G02F 1/1337*   (2006.01)
(Continued)

(52) U.S. Cl.
CPC ...... *G02F 1/136204* (2013.01); *G02F 1/1368* (2013.01); *G02F 1/13394* (2013.01); *G02F 1/13439* (2013.01); *G02F 1/133514* (2013.01); *G02F 1/133707* (2013.01); *G02F 1/134309* (2013.01); *G02F 1/136286* (2013.01); *H01L 27/1244* (2013.01); *H01L 27/326* (2013.01);
(Continued)

(58) Field of Classification Search
CPC ............... H01L 27/1244; H01L 27/124; H01L 27/3244; H01L 27/326; G02F 1/136204; G02F 1/134309; G02F 1/13439; G02F 1/13394; G02F 1/136286; G02F 1/1368; G02F 1/133513; G02F 1/1343; G02F 1/133707; G02F 2201/123; G02F 2201/121
See application file for complete search history.

(56) References Cited

U.S. PATENT DOCUMENTS 9,036,122 B2 *    5/2015   Kim ..................... G02F 1/1393
                                                349/141
2014/0152934 A1 *  6/2014   Huh .................. G02F 1/133707
                                                349/43

(Continued)

FOREIGN PATENT DOCUMENTS

KR    1020130115899    10/2013

*Primary Examiner* — Galina Yushina
(74) *Attorney, Agent, or Firm* — Cantor Colburn LLP

(57) ABSTRACT

A liquid crystal display device includes a pixel electrode that includes a first central portion and a first stem portion and sequentially disposed on one side of a reference line extending in a first direction, and a second central portion and a second stem portion sequentially disposed on the other side, where the first stem portion extends at a first oblique angle in which a center line of a line width has a positive sign with respect to the first direction, the first central portion extends from one end of the first stem portion and has a shape in which a center line of the line width is inclined at a second oblique angle having a positive sign with respect to the first direction, and a line width of the first central portion is smaller than the line width of the first stem portion.

31 Claims, 18 Drawing Sheets

(51) Int. Cl.
  *G02F 1/1362* (2006.01)
  *G02F 1/1343* (2006.01)
  *G02F 1/1339* (2006.01)
  *G02F 1/1368* (2006.01)
  *G02F 1/1335* (2006.01)
  *H01L 27/12* (2006.01)
(52) U.S. Cl.
  CPC .. *G02F 2201/121* (2013.01); *G02F 2201/123* (2013.01)

(56) References Cited

U.S. PATENT DOCUMENTS

| | | | |
|---|---|---|---|
| 2015/0062472 A1* | 3/2015 | Chae | G02F 1/133707 349/33 |
| 2015/0212380 A1* | 7/2015 | Chen | G02F 1/136286 349/42 |
| 2015/0255327 A1* | 9/2015 | Park | H01L 27/124 438/668 |
| 2016/0124275 A1* | 5/2016 | Bae | G02F 1/134336 349/86 |
| 2016/0147112 A1* | 5/2016 | Chae | G02F 1/133514 349/106 |
| 2016/0313618 A1* | 10/2016 | Lee | G02F 1/136227 |
| 2016/0370663 A1* | 12/2016 | Kim | H01L 27/124 |
| 2017/0032751 A1* | 2/2017 | Jung | G09G 3/3648 |

\* cited by examiner

LIQUID CRYSTAL DISPLAY DEVICE

This application claims priority to Korean Patent Application No. 10-2015-0170442, filed on Dec. 2, 2015, and all the benefits accruing therefrom under 35 U.S.C. §119, the content of which in its entirety is herein incorporated by reference.

BACKGROUND

1. Field

Exemplary embodiments of the invention relate to a liquid crystal display device.

2. Description of the Related Art

A liquid crystal display ("LCD") device achieves an image by utilizing electro-optical characteristics of a liquid crystal which changes in light transmittance depending on an intensity of electric field. The LCD device includes a plurality of pixels. Pixel electrodes and color filters are disposed in each pixel. Each of the pixel electrodes is driven by a thin film transistor.

Although the LCD device has various advantages such as being easily thinned, having relatively small power consumption and hardly generating electromagnetic waves or the like harmful to human body, since there is a disadvantage such as a lateral visibility inferior to a front visibility, various types of liquid crystal arrays and structures of the pixel electrodes for overcoming the disadvantage have been developed.

Recently, as a structure of a pixel electrode for achieving a wide viewing angle of the LCD device, a multi-domain structure capable of aligning the liquid crystal molecules in different directions around a predetermined reference line has attracted wide attention. In this case, the pixel electrode and a common electrode are disposed on a single substrate, and a plurality of cutouts is defined in at least one of the pixel electrode and the common electrode. Further, at least one of the pixel electrode and the common electrode may include a plurality of stem portions defined by a plurality of cutouts. When the pixel electrodes are achieved by a double domain, the plurality of stem portions may have a structure that is symmetrical with respect to a reference line, and may have a structure inclined with respect to the reference line at a predetermined angle.

When an external pressure or the like is applied to a vicinity of the reference line, positions of the liquid crystal molecules may be irregular due to an external pressure, and a bruising phenomenon in which the liquid crystal molecules of irregular positions are pushed to the stem portion side and dirt is displayed may occur. As a structure for preventing an occurrence of the bruising phenomenon, an application of a bent structure that is further inclined than a degree of an inclination of the stem portion may be considered in the vicinity of the reference line.

SUMMARY

In applying a bent structure, a vertical separation distance between the bent structures may be relatively shorter than a vertical separation distance between stem portions. As a result, a degree of occurrence of short-circuit failure between the bent structures may be higher than a degree of occurrence of short-circuit failure between the stem portions.

Exemplary embodiments of the invention provide a liquid crystal display ("LCD") device having a short-circuit failure occurrence prevention structure at the central portion of the pixel electrode.

According to an exemplary embodiment of the invention, there is provided an LCD device that includes first and second substrates that face each other, a liquid crystal layer disposed between the first substrate and the second substrate, and a pixel electrode that includes a first central portion and a first stem portion disposed on the first substrate and sequentially disposed on one side of a reference line extending in a first direction in a plan view, and a second central portion and a second stem portion sequentially disposed on the other side opposite to the one side of the reference line in the plan view, where the first stem portion extends at a first oblique angle in which a center line of the line width has a positive sign with respect to the first direction, the first central portion extends from one end of the first stem portion and has a shape in which a center line of the line width is inclined at a second oblique angle having a positive sign with respect to the first direction, and the line width of the first central portion is smaller than the line width of the first stem portion.

In an exemplary embodiment, the absolute value of the first oblique angle may be greater than the absolute value of the second oblique angle.

In an exemplary embodiment, the second stem portion may extend at a third oblique angle in which a center line of the line width has a negative sign with respect to the first direction, the second central portion may extend from one end of the second stem portion and may have a shape in which a center line of a line width is inclined at a fourth oblique angle having a negative sign with respect to the first direction, and the line width of the second central portion may be smaller than the line width of the second stem portion.

In an exemplary embodiment, the absolute value of the first oblique angle and the absolute value of the third oblique angle may be substantially the same, the absolute value of the second oblique angle and the absolute value of the fourth oblique angle may be substantially the same, and the absolute values of the first oblique angle and the third oblique angle may be greater than the absolute values of the second oblique angle and the fourth oblique angle.

In an exemplary embodiment, the first central portion may include one end and the other end, one end of the first central portion may contact the reference line, the other end of the first central portion may be connected to the one end of the first stem portion, the second central portion may include one end and the other end, one end of the second central portion may contact the reference line and the other end of the second central portion may be connected to one end of the second stem portion.

In an exemplary embodiment, a center line of the first stem portion, a center line of the first central portion, a central portion of the second central portion and a center line of the second central portion may be connected to one another.

In an exemplary embodiment, the first stem portion and the second stem portion may be symmetrical with respect to their dispositions the reference line, and the first central portion and the second central portion may be symmetrical with respect to their dispositions to the reference line.

In an exemplary embodiment, the first stem portion may include a first boundary line that defines one side boundary at the first oblique angle with respect to the first direction, and a second boundary line that defines the other side boundary opposite to the one side boundary at the first oblique angle with respect to the first direction, and the first central portion may include a third boundary line that is connected to the first boundary line, is inclined at the fifth oblique angle with respect to the first direction and extends to the reference line to form one side boundary, and a fourth boundary line that is connected to the second boundary line, is inclined at the sixth oblique angle with respect to the first direction and extends to the reference line to form the other side boundary opposite to the one side boundary.

In an exemplary embodiment, the length of the third boundary line may be shorter than the length of the fourth boundary line.

In an exemplary embodiment, the absolute values of the second oblique angle, the fifth oblique angle and the sixth oblique angle may be substantially the same.

In an exemplary embodiment, the absolute values may be larger in order of the fifth oblique angle, the second oblique angle and the sixth oblique angle.

In an exemplary embodiment, a connecting line between one end of the first stem portion and an other end of the first central portion may have a degree of inclination not equal to 0 degree (°) with respect to the first direction.

In an exemplary embodiment, the first central portion may extend from a part of one end of the first stem portion, and the pixel electrode may include a step that is provided at the boundary between the first central portion and the first stem portion.

In an exemplary embodiment, the first central portion may extend from the inside of one end of the first stem portion.

In an exemplary embodiment, the device may further include a gate line that is disposed on the first substrate and extends in the first direction.

In an exemplary embodiment, the first oblique angle may be substantially 85°.

According to another exemplary embodiment of the invention, there is provided an LCD device that includes first and second substrates that face each other; a liquid crystal layer disposed between the first substrate and the second substrate; and a pixel electrode that includes a first stem portion, a first central portion, a third stem portion and a third central portion, the first stem portion is disposed on the first substrate and has, in a plan view, a center line of a line width with extending at a first oblique angle in a first direction, the central portion extends from one end of the first stem portion and has, in the plan view, a center line of a line width inclined at a second oblique angle with respect to the first direction, the third stem portion is spaced apart, in the plan view, from the first stem portion to one side in the first direction and has a center line of a line width extending at the first oblique angle with respect to the first direction, the central portion is spaced apart, in the plan view, from the first central portion to one side in the first direction, extends from one end of the third stem portion and has a center line of a line width with inclined at a second oblique angle with respect to the first direction, and the line width of a spaced region between the first central portion and the third central portion may be greater than a line width of a spaced region between the first stem portion and the third stem portion.

In an exemplary embodiment, the line width of the spaced region between the first stem portion and the third stem portion may have a constant line width, and the spaced region between the first central portion and the third central portion may have a constant line width.

In an exemplary embodiment, a center line of the spaced region between the first stem portion and the third stem portion may have a shape that is inclined at the first oblique angle with respect to the first direction, and a center line of the spaced region between the first central portion and the third central portion may have a shape that is inclined at the second oblique angle with respect to the first direction.

In an exemplary embodiment, the first central portion, the first stem portion, the third stem portion and the third central portion may be disposed on one side of the reference line extending in the first direction, in a plan view, the central portion may include one end and the other end, one end of the first central portion may contact the reference line, the other end of the first central portion may be connected to one end of the first stem portion, the third central portion may include one end and the other end, one end of the third central portion may contact the reference line, the other end of the third central portion may be connected to one end of the third stem portion, and the absolute value of the first oblique angle may be greater than the absolute value of the second oblique angle.

In an exemplary embodiment, a spaced region between the first central portion and the third central portion may have a line width that increases as it approaches the reference line.

In an exemplary embodiment, the device may further include a second stem portion symmetrical to the first stem portion with respect to the reference line, a second central portion symmetrical to the first central portion with respect to the reference line, a fourth stem portions symmetrical to the third stem portion with respect to the reference line, and a fourth central portion symmetrical to the third central portion with respect to the reference line.

In an exemplary embodiment, the first stem portion may include a first boundary line that defines one side boundary at the first oblique angle with respect to the first direction, and a second boundary line that defines the other side boundary opposite to the one side boundary at the first oblique angle with respect to the first direction, the first central portion may include a third boundary line that is connected to the first boundary line, is inclined at the third oblique angle with respect to the first direction and extends to the reference line to form the one side boundary, and a fourth boundary line that is connected to the second boundary line, is inclined at the fourth oblique angle with respect to the first direction and extends to the reference line to form the other side boundary opposite to the one side boundary.

In an exemplary embodiment, a length of the third boundary line may be shorter than a length of the fourth boundary line.

In an exemplary embodiment, the absolute values of the second oblique angle, the third oblique angle, and the fourth oblique angle may be substantially the same.

In an exemplary embodiment, the absolute values may be larger in order of the third oblique angle, the second oblique angle and the fourth oblique angle.

In an exemplary embodiment, a connecting line between one end of the first stem portion and the other end of the first central portion may have a degree of inclination of substantially 0° with respect to the first direction.

In an exemplary embodiment, the first central portion may extend from a part of one end of the first stem portion, and the pixel electrode may include a step that is provided at the boundary between the first central portion and the first stem portion.

In an exemplary embodiment, the first central portion may extend from the inside of one end of the first stem portion.

In an exemplary embodiment, the device may further include a gate line that is disposed on the first substrate and extends in the first direction.

In an exemplary embodiment, the first oblique angle may be substantially 85°.

In an exemplary embodiment, the LCD according to an exemplary embodiment of the invention can prevent a short-circuit failure of the pixel electrode bent portion.

Effects according to the exemplary embodiments of the invention are not limited by the contents illustrated above, and furthermore various effects are included herein.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
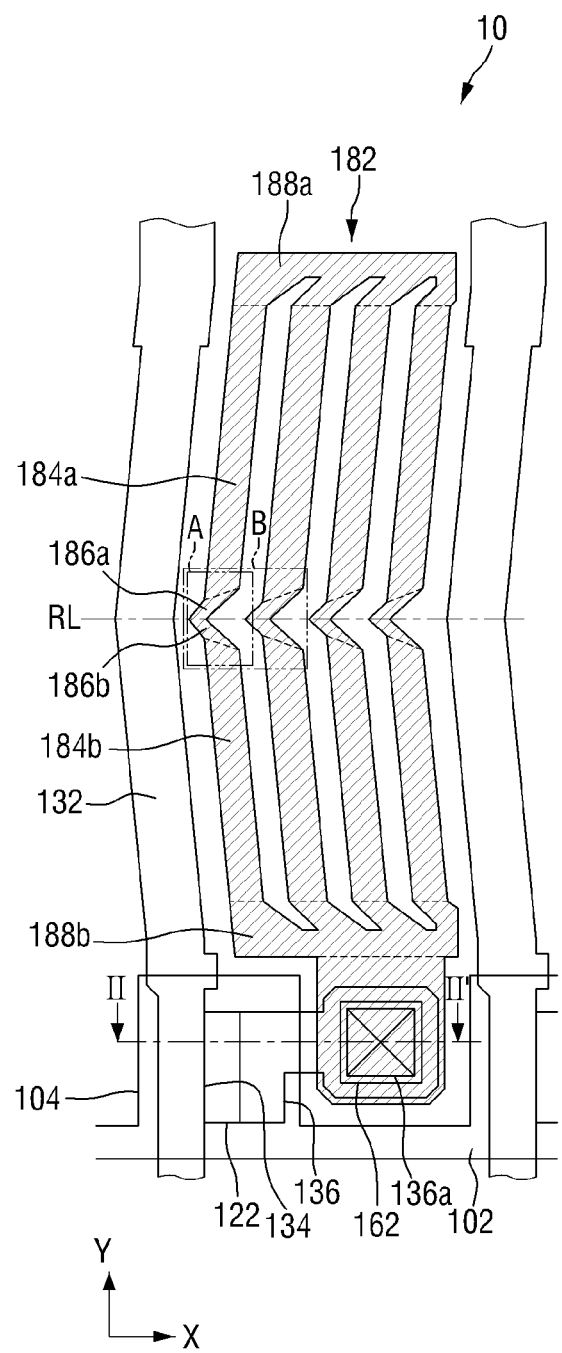
FIG. 1 is a plan view of an exemplary embodiment of a liquid crystal display ("LCD") device according to the invention.

The exemplary embodiments and features of the invention and methods for achieving the exemplary embodiments and features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

The term "on" that is used to designate that an element is on another element or located on a different layer or a layer includes both a case where an element is located directly on another element or a layer and a case where an element is located on another element via another layer or another element. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). In an exemplary embodiment, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the attached drawings.

Figure 2:
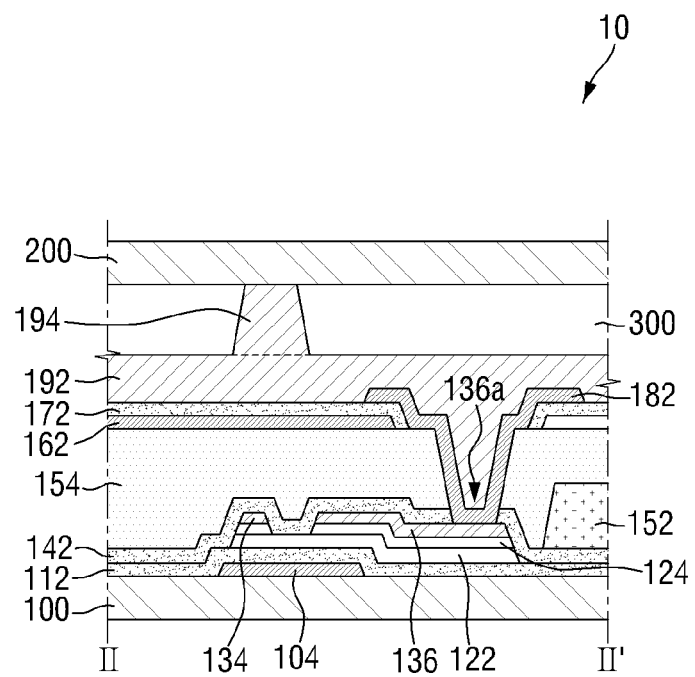
FIG. 2 is a cross-sectional view taken along line II-II' of FIG. 1.
Figure 3:
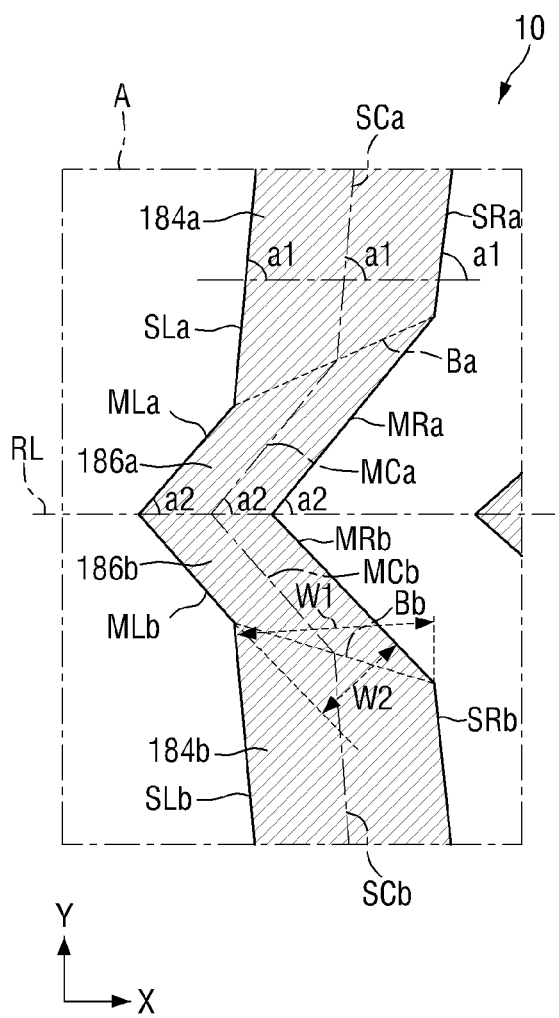
FIG. 3 is an enlarged plan view of a region A of FIG. 1.

FIG. 1 is a plan view of a liquid crystal display ("LCD") device according to an exemplary embodiment of the invention. FIG. 2 is a cross-sectional view taken along line II-II' of FIG. 1. FIG. 3 is an enlarged plan view of a region A of FIG. 1.

Referring to FIGS. 1 to 3, an LCD device 10 according to an exemplary embodiment of the invention includes a first substrate 100 and a second substrate 200 facing each other, and a liquid crystal layer 300 interposed between the first substrate 100 and the second substrate 200.

In an exemplary embodiment, the first substrate 100 and the second substrate 200 may include an insulating material such as a transparent glass, quartz, ceramic, silicone or a transparent plastic, and may be appropriately selected depending on the needs of those skilled in the art. The first substrate 100 and the second substrate 200 may face to each other.

In exemplary embodiments, the first substrate 100 and the second substrate 200 may also have flexibility. That is, the first substrate 100 and the second substrate 200 may be a substrate that can be modified in form, by rolling, folding, bending and the like.

A plurality of gate lines 102 and data lines 132 may be disposed on the first substrate 100.

The gate lines 102 may include a plurality of gate electrodes 104. The data lines 132 may include a plurality of source electrodes 134 and a plurality of drain electrodes 136.

In an exemplary embodiment, the gate lines 102 and gate electrodes 104 and the data lines 132, source electrodes 134 and drain electrodes 136 may include an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chromium (Cr), titanium (Ti), tantalum (Ta) or the like. Moreover, the gate lines 102 and 104, and the data lines 132, 134 and 136 may have a multi-film structure that includes two electrically conductive films (not illustrated) having different physical properties. In an exemplary embodiment, a single conductive film may include an aluminum-based metal, a silver-based metal, a copper-based metal or the like, and the other conductive film may include a molybdenum-based metal, chromium, titanium, tantalum or the like. Examples of these combinations may include a chromium lower film and an aluminum upper film, and an aluminum lower film and a molybdenum upper film. However, the invention is not limited thereto, and the gate lines 102 and gate electrodes 104 and the data lines 132, source electrodes 134 and drain electrodes 136 may include various metals and conductors.

Each gate line 102 may extend in a first direction, e.g., in a horizontal direction (e.g., X-direction) along a boundary of the pixels, and each data line 132 may extend in a second direction, e.g., in a vertical direction (e.g., Y direction) along a boundary of the pixels. The gate lines 102 and the data lines 132 may intersect with each other to define a pixel region. That is, the pixel region may be defined by a region surrounded by the gate lines 102 and the data lines 132.

In exemplary embodiments, the data lines 132 may be periodically bent for improving the transmittance as illustrated in FIG. 1. However, this is an example, and the form of the data lines 132 is not limited thereto in the invention.

At least one gate electrode 104 is arranged in each gate line 102 to be connected for each pixel. The gate electrode 104 may branch from the gate line 102 to the semiconductor layer 122 side or may be provided by extension of the gate line 102. However, it is not limited thereto, and the gate electrode 104 may be defined in a region that overlaps the semiconductor layer 122 on the extension path of the gate line 102.

In each data line 132, at least one source electrode 134 is connected and disposed for each pixel. The source electrode 134 may branch from the data line 132 to the semiconductor layer 122 side or may be provided by extension of the data line 132. However, it is not limited thereto, and the source electrode 134 may be defined in a region that overlaps the semiconductor layer 122 on the extension path of the data line 132. In an exemplary embodiment, the source electrode 134 does not protrude from the data line 132 and may be located on the substantially same line as the data line 132. The drain electrode 136 may be arranged to be spaced apart from the source electrode 134 on the basis of the semiconductor layer 122, and may be electrically connected to the pixel electrode 182 through a contact hole 136a penetrating a first protective film 142, an organic layer 154 and a second protective film 172.

A gate insulating film 112 may be disposed between the gate lines 102 and gate electrodes 104 and the data lines 132, source electrodes 134 and drain electrodes 136. In an exemplary embodiment, the gate insulating film 112 may be disposed on the gate lines 102 and gate electrodes 104, and the data lines 132, source electrodes 134 and drain electrodes 136 may be disposed on the gate insulating film 112. In an exemplary embodiment, the gate insulating film 112, for example, may include silicon nitride (SiNx), silicon oxide (SiO2), silicon oxynitride (SiON) or a laminated film thereof. The gate insulating film 112 may serve to maintain the insulation between the gate lines 102 and gate electrodes 104 and conductive thin films such as the data lines 132 located on the top thereof.

The semiconductor layer 122 is disposed on the gate insulating film 112 and may include, for example, hydrogenated amorphous silicon or polycrystalline silicon. The semiconductor layer 122 at least partially overlaps the gate electrode 104. The semiconductor layer 122 constitutes a thin film transistor, together with the gate electrode 104, the source electrode 134 and the drain electrode 136.

In exemplary embodiments, the semiconductor layer 122 may be linearly achieved. The exemplary embodiment of FIG. 3 illustrates a case where the semiconductor layer 122 is linearly achieved. When the semiconductor layer 122 is linearly achieved, the semiconductor layer 122 may overlap the data lines 132, source electrodes 134 and drain electrodes 136. However, this is an example, and the semiconductor layer 122 may also be achieved in a various shapes such as an island shape.

An ohmic contact layer 124 including n+hydrogenated amorphous silicon doped with n-type impurity at a high concentration may be disposed on the semiconductor layer 122. The ohmic contact layer 124 is located between the lower semiconductor layer 122 and the upper source electrode 134 and the drain electrode 136 to serve to reduce the contact resistance. The ohmic contact layer 124 may have various shapes such as a linear shape or an island shape, similarly to the semiconductor layer 122. When the semiconductor layer 122 has a linear shape, the ohmic contact layer 124 may also have a linear shape, and when the semiconductor layer 122 has an island shape, the ohmic contact layer 124 may also have an island shape, for example. Unlike the semiconductor layer 122, in the ohmic contact layer 124, since a space in which the source electrode 134 and the drain electrode 136 are spaced apart from each other while facing is separated, the lower semiconductor layer 122 may be exposed. In the semiconductor layer 122, a channel may be defined in a region in which the source electrode 134 and the drain electrode 136 are spaced with each other while facing.

When the gate electrode 104 receives application of a gate-on signal and the channel is defined in the semiconductor layer 122, the thin film transistor is turned on, and the drain electrode 136 receives provision of the data signal from the source electrode 134 and may transmit the data signal to the pixel electrode 192.

A first protective film 142 (also referred to as "passivation layer") is disposed on the data lines 132, source electrodes 134 and drain electrodes 136 and the exposed semiconductor layer 122. A contact hole 136a may be defined in the first protective film 142 and an organic layer 154 to be described below, and the contact hole 136a exposes at least a part of the drain electrode 136. At least a part of the drain electrode 136 exposed through the contact hole 136a may contact the pixel electrode 182. Thus, the drain electrode 136 and the pixel electrode 182 may be electrically coupled or connected.

In an exemplary embodiment, the first protective film 142, for example, may include inorganic substances such as silicon nitride or silicon oxide, and substances such as a-Si:C:O and a-Si:O:F provided by plasma enhanced chemical vapor deposition ("PECVD").

The organic layer 154 may be disposed on the first protective film 142. The organic layer 154 may include a material that has excellent planarization characteristics and has photosensitivity. A contact hole 136a that exposes at least a part of the drain electrode 136 may be defined in the organic layer 154.

In exemplary embodiments, as illustrated in FIG. 2, a color filter 152 may be disposed between the organic layer 154 and the first protective film 142. In an exemplary embodiment, the color filter 152 may include a red ("R") color filter, a green ("G") color filter and a blue ("B") color filter. Each of the R, G and B color filters is provided in one pixel to form R, G, and B pixels. The color filter 152 may overlap the pixel electrode 182. The color filter 152 may include a photosensitive organic material including a pigment. An organic layer 154 is disposed on the color filter 152 to flatten the steps of the R, G and B color filters. The color filter 152 may be covered with the organic layer 154. That is, since the color filter 152 is covered with an organic layer 154, it may not have an exposed part. However, this is an example, and the invention is not limited to this structure.

A common electrode 162 may be disposed on the organic layer 154. The common electrode 162 receives application of a common voltage and generates an electric field with the pixel electrode 182, thereby controlling the alignment direction of liquid crystal molecules included in the liquid crystal layer 300. The common electrode 162 includes an opening that exposes a region in which the contact hole 136a is defined. That is, at least a part of the drain electrode 136 may be exposed through the opening defined in the common electrode 162. The common electrode 162 may be integrally provided over the entire pixel region surrounded by the gate lines 102 and the data lines 132, except for the opening. In an exemplary embodiment, the common electrode 162 may include a transparent conductive material such as indium tin oxide ("ITO") or indium zinc oxide ("IZO"), but it is not limited thereto.

Although it is not illustrated, in exemplary embodiments, the organic layer 154 may not be included, and the color filter 152 may be disposed on the second substrate 200. In this case, the common electrode 162 may be directly disposed on the first protective film 142.

A second protective film 172 may be disposed on the common electrode 162 and the organic layer 154. The second protective film 172 may include an opening that exposes the region in which the contact hole 136a is defined. That is, at least a part of the drain electrode 136 may be exposed through the opening defined in the second protective film 172. The second protective film 172 may be an inorganic insulating material. In an exemplary embodiment, the second protective film 172 may include silicon nitride, silicon oxide or the like. The second protective film 172 may be located between the pixel electrode 182 and the common electrode 162 to insulate the pixel electrode 182 and the common electrode 162 from each other.

The pixel electrodes 182 may be disposed on the second protective film 172 for each unit pixel. At least a part of the pixel electrode 182 may overlap the common electrode 162. A part of the pixel electrode 182 is disposed inside the contact hole 136a. Some of the pixel electrodes 182 disposed inside the contact hole 136a may contact and electrically connected to the drain electrode 136.

When the data voltage is applied to the pixel electrode 182 through the contact hole 136a, an electric field is generated in the direction from the pixel electrode 182 to the lower common electrode 162. That is, the pixel electrode 182 may form an electric field with the common electrode 162 to rotate the liquid crystal molecules included in the liquid crystal layer 300. In an exemplary embodiment, the pixel electrode 182 may include a transparent conductive material such as ITO or IZO, but it is not limited thereto.

In exemplary embodiments, the pixel electrode 182 may be achieved by upper and lower double domains. As in the exemplary embodiments of FIGS. 1 and 3, the pixel electrode 182 may include stem portions 184a, 184b, central portions 186a, 186b, edge portions 188a, 188b and a slit 182a. The stem portions 184a, 184b may extend to be inclined at a first oblique angle a1 with respect to the first direction (e.g., X-direction), and may be symmetrical to a second direction (e.g., Y-direction) about a reference line RL. Thus, the pixel electrode 182 may be achieved by a double domain capable of aligning the liquid crystal molecules included in the liquid crystal layer 300 in the vertically different directions around the reference line RL.

Specific structures of the stem portions 184a, 184b, the central portions 186a, 186b, the edge portions 188a, 188b and the slit 182a of the pixel electrode 182 will be described below in more detail.

A light-shielding pattern 192 may be disposed on the second protective film 172 and the pixel electrode 182. The light-shielding pattern 192 may serve to prevent the light leakage. The light-shielding pattern 192 may be disposed in a thin film transistor region and a non-pixel region in which includes a gate line and a data line region between the pixels. The light-shielding pattern 192 may be disposed in the contact hole 136a as illustrated in FIG. 2. However, this is an example, and the light-shielding pattern 192 is not limited to this structure.

In an exemplary embodiment, the light-shielding pattern 192 may include a black organic polymeric material including a black dye or pigment, or a metal (e.g., metal oxide) such as chromium and chromium oxide.

A column spacer 194 is provided to maintain an interval between the first substrate 100 and the second substrate 200, and the column spacer 194 may be disposed on the light light-shielding pattern 192. In exemplary embodiments, an end of the column spacer 194 may abut against the second substrate 200 side, as illustrated in FIG. 2. However, this is an example, and the end of the column spacer 194 may also be spaced apart the from second display substrate 200 at a predetermined distance.

Although it is not illustrated, the column spacer 194 may be achieved to include a plurality of column spacers with different steps. In an exemplary embodiment, the column spacer may include a main column spacer with a relatively high step, and a sub column spacer with a relatively low step. In this case, the interval between the first substrate 100 and the second substrate 200 from the external pressure may be primarily maintained by the main column spacer, and when the greater pressure is applied, the interval between the first substrate 100 and the second substrate 200 may be secondarily maintained by the sub column spacer.

The column spacer 194 may be provided in a region corresponding to the thin film transistor. At least a part of the column spacer 194 may overlap the gate lines 102 and 104. However, this is an example, and the arrangement of the column spacer 194 is not limited thereto.

Although it is not illustrated, an alignment film (not illustrated) may be disposed on each of one side of the first substrate 100 and one side of the second substrate 200 facing the liquid crystal layer 300. That is, an alignment film (not illustrated) capable of aligning the liquid crystal layer 300 may be disposed on the pixel electrode 182, the second protective film 172, the light-shielding pattern 192 and the column spacer 194.

A liquid crystal layer 300 including liquid crystal molecules (not illustrated) having a positive dielectric anisotropy or a negative dielectric anisotropy may be interposed between the first substrate 100 and the second substrate 200.

In exemplary embodiments, the column spacer 194 may include the same material as the light-shielding pattern 192. The column spacer 194 and the light-shielding pattern 192 may be simultaneously provided through a single patterning process using a half-tone mask or a slit mask exposure. That is, the column spacer 194, 196 and the light-shielding pattern 192 may include the same material and may be integrally achieved.

Hereinafter, the structure of the pixel electrode 182 of the LCD device 10 according to an exemplary embodiment of the invention will be described in detail.

Referring to FIGS. 1 and 3, in the exemplary embodiment, the pixel electrode 182 is achieved as a double domain, and includes the stem portions 184a, 184b, the central portions 186a, 186b and the edge portions 188a, 188b.

The stem portions 184a, 184b include one ends and the other ends, one ends of the stem portions 184a, 184b may be connected to the central portions 186a, 186b, and the other ends of the stem portions 184a, 184b may be connected to the edge portions 188a, 188b, respectively.

In exemplary embodiments, the stem portions 184a, 184b may have a predetermined line width and may have a shape that extends in a predetermined direction. In an exemplary embodiment, as in the example of FIG. 3, the stem portions 184a, 184b may have a fixed line width W1 and may have a shape in which the center lines SCa, SCb of the line width W1 extend at the first oblique angle a1 with respect to the first direction (e.g., X-direction). The first oblique angle a1 may be an acute angle. Specifically, the center line SCa may have a shape that extends at the first oblique angle a1 having the positive sign with respect to the first direction (e.g., X-direction), and the center line SCb may have a shape that extends at the first oblique angle a1 having a negative sign with respect to the first direction (e.g., X-direction).

Here, the oblique angle in a counterclockwise direction with respect to the first direction (e.g., X-direction) may have a positive sign, and the oblique angle in a clockwise direction may have a negative sign. This can be similarly applied in conjunction with the sign of the oblique angle to be described below.

The stem portions 184a, 184b may include boundary lines that are spaced apart from each other in a direction perpendicular to the extension direction when viewed in a plan view. In an exemplary embodiment, as in the exemplary embodiment of FIG. 3, the stem portions 184a, 184b may include a first boundary line SLa that defines one side boundary of the stem portions 184a, 184b, and a second boundary line SRa that is spaced apart from the first boundary line SLa in a direction perpendicular to the extension direction to form the other side boundaries 184a, 184b.

In exemplary embodiments, the extension direction of the first boundary line SLa and the second boundary line SRa may extend in the same direction as the extension direction of the center line SCa of the line width. In an exemplary embodiment, as in the exemplary embodiment of FIG. 3, the first boundary line SLa and the second boundary line SRa may extend at the first oblique angle a1 having the positive sign with respect to the first direction (e.g., X-direction). In this case, the first boundary line SLa and the second boundary line SRa may be substantially parallel to each other. In other words, the line width W1 of the stem portions 184a, 184b may be constant. In this case, the degrees of inclination of the first boundary line S1a, the second boundary line SRa and the center lines SCa, SCb with respect to the first direction (e.g., X-direction) may be the same at the first oblique angle a1. However, this is an example and is not limited thereto.

Here, the line width W1 of the stem portions 184a, 184b may be a separation distance in the direction perpendicular to the extension direction of the boundary line between the first boundary line SLa and the second boundary line SRa. However, when the other boundary line is not located in the direction perpendicular to the extension direction of one of the first boundary line SLa or the second boundary line SRa, a separation distance between the one boundary line and a virtually extending line of the other ordinary line may become line widths of stem portions 184a, 184b. The concept of the line widths of the stem portions 184a, 184b may also be similarly applied to the concept of line widths of the central portions 186a, 186b to be described below.

Here, the center lines SCa, SCb of the line widths of the stem portions 184a, 184b may be lines that connect the center points of the line widths of the stem portions 184a, 184b.

In exemplary embodiments, the stem portions 184a, 184b may include a first stem portion 184a and a second stem portion 184b. The first stem portion 184a and the second stem portion 184b may be symmetrical to each other about a predetermined reference line. In an exemplary embodiment, as in the exemplary embodiment of FIG. 3, the first stem portion 184a and the second stem portion 184b may be symmetrical to each other in the second direction (e.g., Y-direction) about the reference line RL. Thus, the center line SCa of the first stem portion 184a and the center line SCb of the second stem portion 184b may be symmetrical to each other in the second direction (e.g., Y-direction) about the reference line RL. The reference line RL may be a line that extends across the center of the pixel, but this is an example, and a relation between the reference line RL and the pixel is not limited thereto.

The central portions 186a, 186b may extend from one end of the stem portions 184a, 184b and may have a shape that is bent in a direction different from the extension direction of the stem portions 184a, 184b. Since the central portions 186a, 186b extend from one ends of the stem portions 184a, 184b, the central portions 186a, 186b and the stem portions 184a, 184b may be integrated with each other.

The edge portions 188a, 188b may include portions extending from the other ends of the stem portions 184a, 184b. The edge portions 188a, 188b may include a shape that is bent in a direction different from the extension direction of the stem portions 184a, 184b. Since the edge portions 188a, 188b extend from the other ends of the stem portions 184a, 184b, the central portions 186a, 186b and the stem portions 184a, 184b may be integrated with each other.

In exemplary embodiments, the edge portions 188a, 188b may include a first edge portion 188a and a second edge portion 188b, and the first edge portion 188a and the second edge portion 188b may be symmetrical with each other in the second direction (e.g., Y-direction) about the reference line RL.

In exemplary embodiments, the central portions 186a, 186b may be achieved to have a constant line width. In an exemplary embodiment, as in the exemplary embodiment of FIG. 3, the central portions 186a, 186b may be achieved in a shape in which the center lines MCa, MCb of the line width W2 are inclined at a second oblique angle a2 with respect to the first direction (e.g., X-direction). Specifically, the center line MCa may be a shape inclined at the second oblique angle a2 having a positive sign with respect to the first direction (e.g., X-direction), and the center line MCb may have a shape that is inclined at the second oblique angle a2 having a negative sign with respect to the first direction (e.g., X-direction). The second oblique angle a2 may be an acute angle. At this time, the absolute value of the second oblique angle a2 may be smaller than the absolute value of the first oblique angle a1.

In exemplary embodiments, the central portions 186a, 186b may include a first central portion 186a and a second central portion 186b. The first central portion 186a and the second central portion 186b may be symmetrical with each other about a predetermined reference line. In an exemplary embodiment, as in the exemplary embodiment of FIG. 3, the first central portion 186a and the second central portion 186b may be symmetrical to each other in the second direction (e.g., Y-direction) about the reference line RL, for example. Thus, the center line MCa of the first central portion 186a and the central line MCb of the second central portion 186b may be symmetrical to each other in the second direction (e.g., Y-direction) about the reference line RL. The reference line RL may be a line that extends across the center of the pixels, but this is an example, and a relation between the reference line RL and the pixel is not limited thereto.

The first central portion 186a and the first stem portion 184a may be sequentially disposed on one side of the reference line RL, for example, on the upper side of FIG. 3. That is, the first central portion 186a may be disposed relatively closer to the reference line RL than the first stem portion 184a. As illustrated in FIG. 3, the first central portion 186a includes one end and the other end, one end of the first central portion 186a may be connected to the other end of the first stem portion 184a, and the other end of the first central portion 186a may contact the reference line RL. Such contents can also be substantially equally applied to the second central portion 186b. Thus, the other end of the first central portion 186a may be connected to one end of the second central portion 186b.

When an external pressure or the like is applied to the central region of the pixel, the position of the liquid crystal molecules may be irregular due to the external pressure, and a bruising phenomenon in which the liquid crystal molecules of irregular position are pushed to the stem portion side to display dirty may occur. However, in the pixel electrode 182 of the LCD device 10 according to an exemplary embodiment of the invention, since the central portions 186a, 186b are achieved as a structure that is bent from the stem portions 184a, 184b in a direction different from the extension direction of the stem portions 184a, 184b, even in the case of the liquid crystal molecules of the irregular position due to the external pressure, a phenomenon of being pushed to the stem portions 184a, 184b side beyond the boundary between the central portions 186a, 186b and the stem portions 184a, 184b may be prevented, or the degree of pushing may be at least partially alleviated.

However, by including such a bent structure, the vertical separation distance between the mutually adjacent central portions in the first direction (e.g., X-direction) may become relatively shorter than the vertical separation space between the mutually adjacent central portions in the first direction (e.g., X-direction). As a result, the degree of occurrence of the short-circuit failure between the mutually adjacent central portions in the first direction (e.g., X-direction) may be higher than the degree of occurrence of the short-circuit failure between the mutually adjacent stem portions in the first direction (e.g., X-direction). Here, the vertical separation distance refers to a separation distance from the boundary line of the central line (or the stem portion) to the boundary line of the other central portion (or the stem portion) that is adjacent in the direction perpendicular to the extension direction of the boundary line.

This, in order to prevent an occurrence of short-circuit failure between the mutually adjacent central portions in the first direction (e.g., X-direction) as described above, the LCD device 10 according to an exemplary embodiment of the invention may be achieved by a structure in which the line width W2 of the central portions 186a, 186b is smaller than the line width W1 of the stem portions 184a, 184b. This makes it possible to ensure the vertical separation between the mutually adjacent central portions in the first direction (e.g., X-direction), as compared to a structure in which the line width of the central portion is the same as the line width of the stem portion, and thus, the degree of occurrence of the short-circuit failure occurring between the central portions may be alleviated.

In exemplary embodiments, the central portions 186a, 186b may have an asymmetrical shape on the basis of the center line MCa of the line width. In an exemplary embodiment, as in the exemplary embodiment of FIG. 3, the central portions 186a, 186b have a regular line width W2, but the shape of the left portion in FIG. 3 and the shape of the right portion of FIG. 3 may be different from each other on the basis of the center line MCa, for example.

In exemplary embodiments, the central portions 186a, 186b may include boundary lines that are connected/continuous with the boundary lines SLa, SRa, SLb and SRb of the stem portions 184a, 184b. In an exemplary embodiment, as in the exemplary embodiment of FIG. 3, the first central portion 186a may include a third boundary line MLa connected to the first boundary line SLa, and a fourth boundary line MRa connected to the second boundary line SRa, for example.

In exemplary embodiments, the length of the third boundary line MLa and the length of the fourth boundary line MRa may be different from each other. In an exemplary embodiment, as in the exemplary embodiment of FIG. 3, the length of the third boundary line MLa may be shorter than the length of the fourth boundary line MRa, for example. As a result, a structure in which the line width W2 of the first central portion 186a is a smaller than the line width W1 of the first stem portion 184a may be achieved. Thus, a connecting line Ba between one end of the first stem portion 184a and the other end of the first central portion 186a may have a shape that is inclined, while forming an oblique angle in the first direction (e.g., X-direction).

In exemplary embodiments, the third boundary line MLa, the fourth boundary line MRa, and the center line MCa may be the same in the degree of inclination with respect to the first direction (e.g., X-direction). Specifically, as illustrated in FIG. 3, the third boundary line MLa, the fourth boundary line MRa and the center line MCa may be achieved as a shape that is inclined at the second oblique angle a2 with respect to the first direction (e.g., X-direction). In this case, the third boundary line MLa and the fourth boundary line MRa may be substantially parallel to each other. In other words, the line width W2 of the first central portion 186a may be constant. However, this is an example and the line width is not limited thereto.

The description of the first central portion 186a and the first stem portion 184a may also be substantially equally applied to the second central portion 186b and the second stem portion 184b. That is, the relation between the boundary lines MLb, MRb of the second central portion 186b and the boundary lines SLb, SRb of the second stem portion 184b may be substantially the same as the relation between the boundary lines MLa, MRa of the first central portion 186a and the boundary lines SLa, SRa of the first stem portion 184a. That is, the description of the center line MCa of the first central portion 186a may also be substantially equally applied to the center line MCb of the second central portion 186b, and the description of the center line SCa of the first stem portion 184a may also be substantially equally applied to the center line SCb of the second stem portion 184b. The description of the connecting line Ba between the one end of the first stem portion 184a and the other end of the first central portion 186a may also be substantially equally applied to the other connecting line Bb.

The LCD device 10 according to an exemplary embodiment of the invention is achieved by a structure in which the line width W2 of the central portions 186a, 186b is smaller than the line width W1 of the stem portions 184a, 184b, and thus, the vertical separation distance between the central portions adjacent to each other in the first direction (e.g., X-direction) is equal to or longer than the vertical separation distance between the stem portions adjacent to each other in the first direction (e.g., X-direction).

Figure 4:
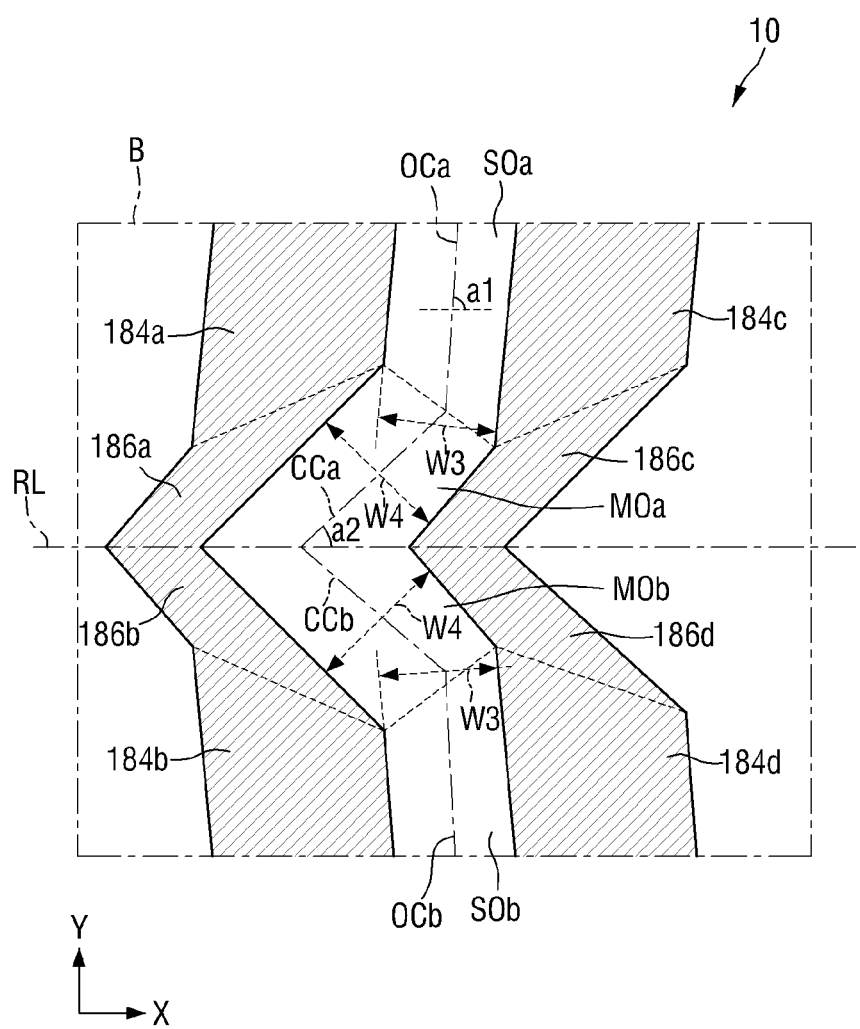
FIG. 4 is an enlarged plan view of a region B of FIG. 1.

Referring to FIG. 4, in exemplary embodiments, the pixel electrode 182 (refer to FIG. 1) may include a third stem portion 184c spaced apart from one side in the first direction (e.g., X-direction) of the first stem portion 184a on the plane, a fourth stem portion 184d spaced apart from one side in the first direction (e.g., X-direction) of the second tem section 184b, a third central portion 186c spaced apart from one side in the first direction (e.g., X-direction) of the first central portion 186a, and a fourth central portion 186d spaced apart from one side in the first direction (e.g., X-direction) of the second central portion 186b.

The description of the first stem portion 184a and the second stem portion 184b may also be substantially equally applied to the third stem portion 184c and the fourth stem portion 184d, and similarly, the description of the first central portion 186a and the second central portion 186b may be substantially equally applied to the third central portion 186c and the fourth central portion 186d.

The spaced region between the first stem portion 184a and the third stem portion 184c may have a shape that has a predetermined line width and extends in a predetermined direction. In an exemplary embodiment, as in the exemplary embodiment of FIG. 4, the spaced region SOa between the first stem portion 184a and the third stem portion 184c may have a constant line width W3, and may have a shape in which the center line OCa of the line width W3 extends at the first oblique angle a1 with respect to the first direction (e.g., X-direction), for example. The spaced region SOb between the second stem portion 184b and the fourth stem portions 184d may also have a constant line width W3, and may have a shape in which the center line OCb of the line width W3 extends at the first oblique angle a1 with respect to the first direction (e.g., X-direction).

The spaced region between the first central portion 186a and the third central portion 186c may also be achieved with a constant line width. As in the exemplary embodiment of FIG. 4, the spaced region MOa between the first central portion 186a and the third central portion 186c may also have a constant line width W4, and may be achieved in a shape in which the center line CCa of the line width W4 is inclined at the second oblique angle a2 with respect to the first direction (e.g., X-direction). The spaced region MOb between the second central portion 186b and the fourth central portion 186d may also have a constant line width W4, and may be achieved in a shape in which the center line CCb of the line width W4 is inclined at the second oblique angle a2 with respect to the first direction (e.g., X-direction).

The line width W4 of the spaced region MOa between the first central portion 186a and the third central portion 186c may be greater than or equal to the line width W3 of the spaced region SOa between the first stem portion 184a and the third stem portion 184c. Thus, as compared to a structure in which the line width of the spaced region between the central portions adjacent to each other in the first direction (e.g., X-direction) is smaller than the line width of the spaced region between the stem portions adjacent to each other in the first direction (e.g., X-direction), the extent of the short-circuit failure occurring in the central portion may be alleviated.

In exemplary embodiments, the line width W1 of the stem portions 184a, 184b and the line width W3 of the spaced regions SOa, Sob between the stem portions may be achieved at a ratio of approximately 0.5:1, 1:1 and 2:2, for example. In an exemplary embodiment, the sum of the line width W1 and the line width W3 may be approximately 3 um and 9 um, for example. In an exemplary embodiment, the first oblique angle a1 may be about 85 degrees, and the second oblique angle a2 may be about 20 degrees to 65 degrees, for example. However, such numerical values are examples, and the invention is, of course, not limited thereto.

Figure 5:
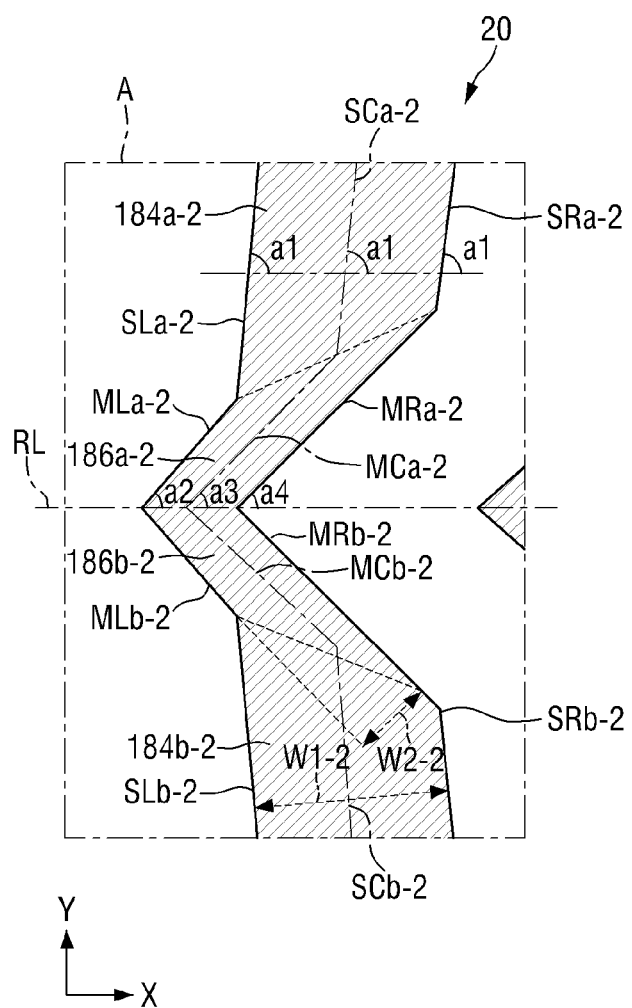
FIG. 5 is an enlarged plan view of a region corresponding to the region A of FIG. 1 of an LCD device according to another embodiment of the invention.
Figure 6:
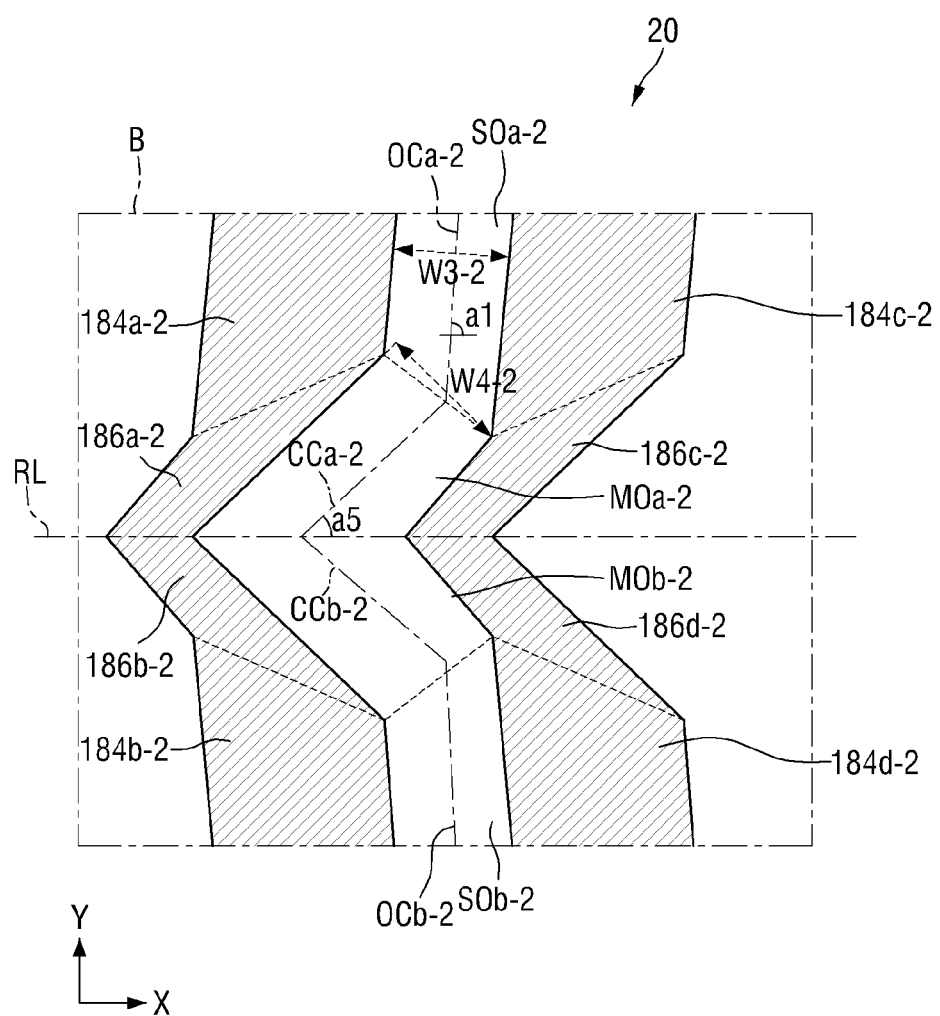
FIG. 6 is an enlarged plan view of another embodiment of a region corresponding to the region B of FIG. 1 of an LCD device according to the invention.

FIG. 5 is an enlarged plan view of a region corresponding to the region A of FIG. 1 of an LCD device according to another embodiment of the invention. FIG. 6 is an enlarged plan view of a region corresponding to the region B of FIG. 1 of an LCD device according to another embodiment of the invention.

Referring to FIGS. 5 and 6, the LCD device 20 according to another embodiment of the invention is different from the aforementioned LCD device 10 in the degree to which the fourth boundary lines MRa-2 and MRb-2 between the central portions 186a-2, 186b-2 are inclined with respect to the first direction (e.g., X-direction), and other configurations are identical or similar. Hereinafter, differences except for the repeated portions will be mainly described.

The pixel electrode 182 in the exemplary embodiment includes the stem portions 184a-2, 184b-2, 184c-2 and 184d-2 and the central portions 186a-2, 186b-2, 186c-2 and 186d-2.

The description of the stem portions 184a, 184b, 184c and 184d described through FIGS. 1 to 4 may be substantially equally applied to the stem portions 184a-2, 184b-2, 184c-2 and 184d-2 in the exemplary embodiment. That is, the description of the stem portions 184a, 184b, 184c and 184d described through FIGS. 1 to 4 may be substantially equally applied to the description of the boundary lines SLa-2, SRa-2, SLb-2 and SRb-2 of the stem portions 184a-2, 184b-2, 184c-2 and 184d-2, the center lines SCa-2, SCb-2, the spaced regions SOa-2, SOb-2 in the first direction (e.g., X-direction) between the stem portions 184a-2, 184b-2, 184c-2 and 184d-2, and the center lines OCa-2, OCb-2 of the spaced regions SOa-2, SOb-2.

In the exemplary embodiment, the central portions 186a-2, 186b-2, 186c-2 and 186d-2 include a first central portion 186a-2, a second central portion 186b-2, a third central portion 186c-2, and a fourth central portion 186d-2. The first central portion 186a-2 may include a third boundary line MLa-2 connected to the first boundary line SLa-2, and a fourth boundary lines MRa-2 connected to the second boundary line SRa-2. The length of the third boundary line MLa-2 and the length of the fourth boundary line MRa-2 may be different from each other. In an exemplary embodiment, as in the exemplary embodiment of FIG. 5, the length of the third boundary line MLa-2 may be shorter than the length of the fourth boundary line MRa-2, for example. Thus, the LCD device may be achieved by a structure in which the line width W2-2 of the first central portion 186a-2 is smaller than the line width W1-2 of the first stem portion 184a-2.

In exemplary embodiments, the first central portion 186a-2 may be achieved by a structure in which the line width decreases as it is closer to the reference line RL. In an exemplary embodiment, as in the exemplary embodiment of FIG. 5, the first central portion 186a-2 may have the maximum line width W2-2 on the other end contacting the first stem portion 184a-2, and the line width W2-2 may gradually decrease as it is closer to the reference line RL and may have the minimum value at one end contacting the reference line RL, for example. The maximum line width W2-2 of the first central portion 186a-2 may be smaller than the line width W1-2 of the first stem portion 184a-2. In this case, the first central portion 186a-2 may be achieved in a shape in which the third boundary line MLa-2 is inclined at a second oblique angle a2 with respect to the first direction (e.g., X-direction) and in a shape in which the fourth boundary line MRa-2 is inclined at a fourth oblique angle a4 with respect to the first direction (e.g., X-direction), and the center line MCa-2 may be achieved in a shape that is inclined at a third oblique angle a3 with respect to the first direction (e.g., X-direction). At this time, the second oblique angle a2 may be larger than the third oblique angle a3, and the third oblique angle a3 may be larger than the fourth oblique angle a4.

The description of the first central portion 186a-2 may also be substantially equally applied to the second central portion 186b-2, the third central portion 186c-2 and the fourth central portion 186d-2.

In exemplary embodiments, the spaced region MOa-2 between the first central portion 186a-2 and the third central portion 186c-2 may be achieved by a structure in which the line width increases as it is closer to the reference line RL. As in the exemplary embodiment of FIG. 6, the line width W4-2 of the spaced region MOa-2 may be minimum at the other end contacting the spaced region SOa-2 between the first stem portion 184a-2 and the third stem portion 184c-2, and the line width W4-2 gradually increases as it is closer to the reference line RL, and the line width may be maximum at one end contacting the reference line RL, for example. The minimum line width W4-2 of the spaced region MOa-2 may be greater than or equal to the line width W3-2 of the spaced region SOa-2 between the first stem portion 184a-2 and the third stem portion 184c-2. In this case, the center line CCa-2 may be achieved in a shape that is inclined at a fifth oblique angle a5 with respect to the first direction (e.g., X-direction), and the fifth oblique angle a5 may be smaller than the second oblique angle a2.

Description of the spaced region MOa-2 between the first central portion 186a-2 and the third central portion 186c-2 may also be substantially equally applied to the spaced region MOb-2 between the second central portion 186b-2 and the fourth central portion 186d-2.

As described above, as the line width between the central portions 186a-2, 186b-2, 186c-2 and 186d-2 is achieved by a structure in which the line width decreases as it is closer to the reference line RL, as compared to a structure in which the line width of the central portion is the same as the line width of the stem portion, it is possible to secure the separation distance between the central portions adjacent to each other in the first direction (e.g., X-direction), and the degree of short-circuit failure occurring between the central portions may be alleviated.

As described above, since the line width of the spaced regions MOa-2, MOb-2 between the central portions 186a-2, 186b-2, 186c-2 and 186d-2 is achieved by a structure in which the line width increases as it is closer to the reference line RL, as compared to a structure in which the line width of the spaced region between the central portions is smaller than the spaced region between the stem portions, the degree of short-circuit failure occurring between the central portions may be alleviated.

Figure 7:
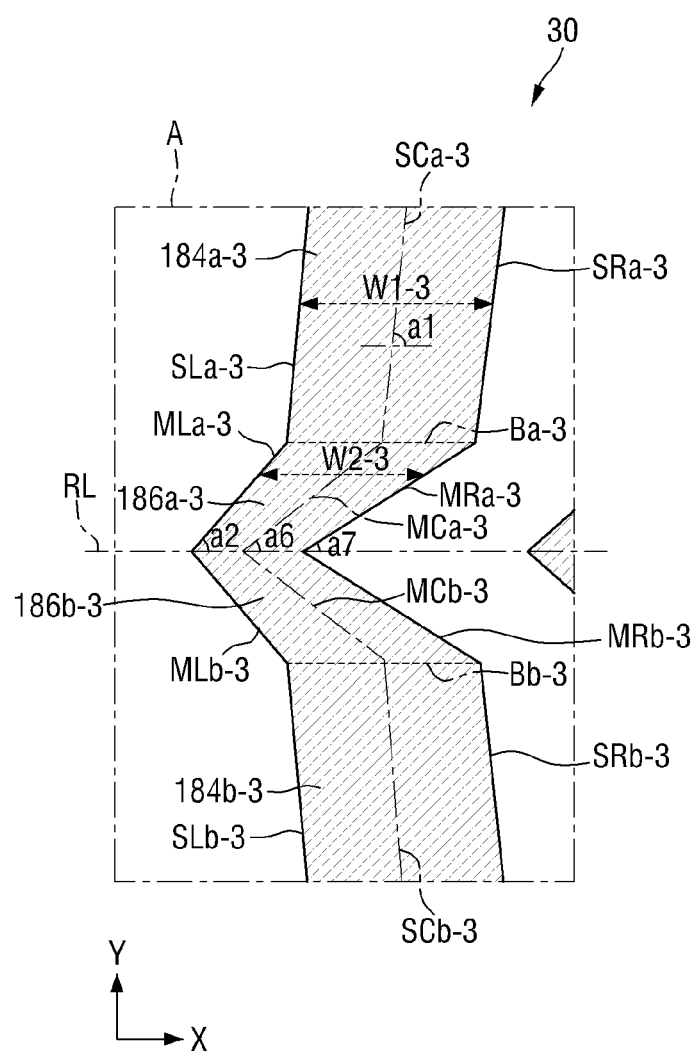
FIGS. 7, 9, 11, 13 and 15 are enlarged plan views of another embodiment of a region corresponding to the region A of FIG. 1 of an LCD device according to the invention.
Figure 8:
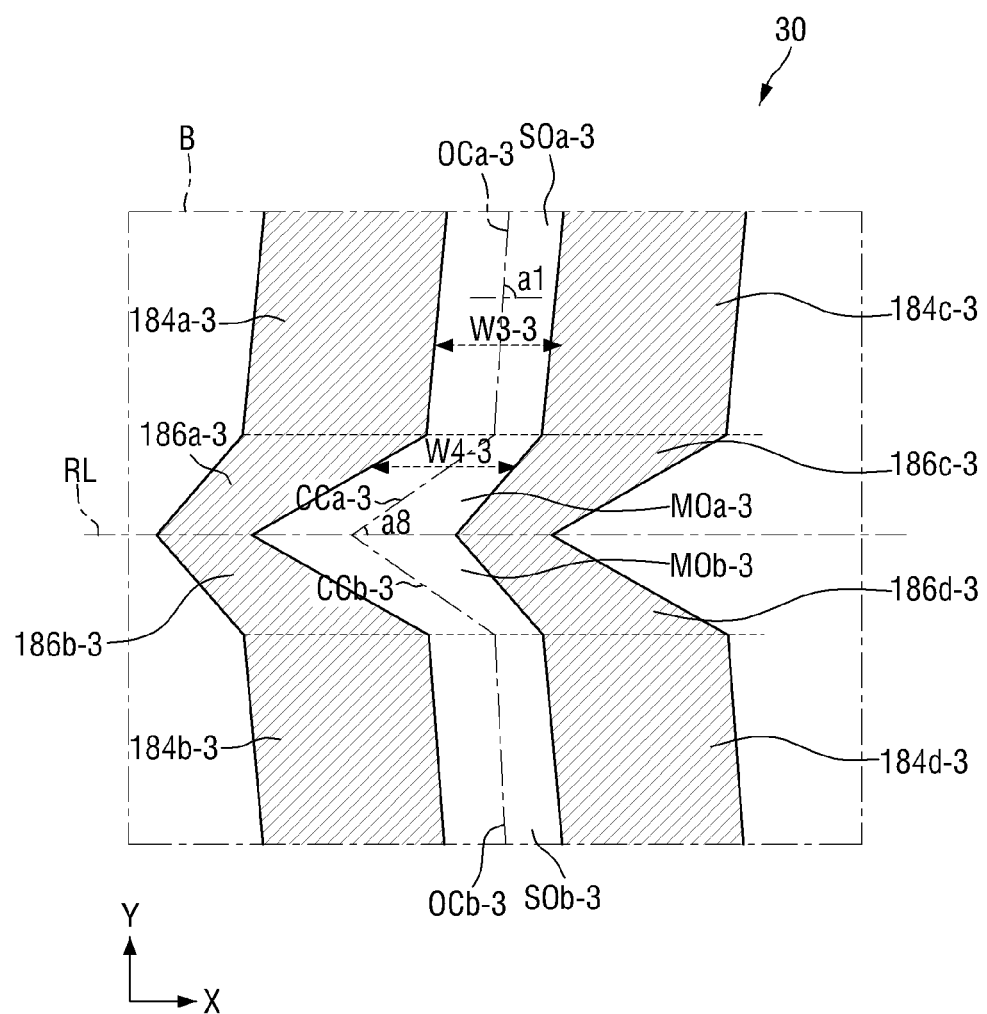
FIGS. 8, 10, 12, 14, 16 and 17 are enlarged plan views of another embodiment of a region corresponding to the region B of FIG. 1 of an LCD device according to the invention.

FIG. 7 is an enlarged plan view of a region corresponding to the region A of FIG. 1 of an LCD device according to another embodiment of the invention. FIG. 8 is an enlarged plan view of a region corresponding to the region B of FIG. 1 of an LCD device according to another embodiment of the invention.

Referring to FIGS. 7 and 8, an LCD device 30 according to another embodiment of the invention is different from the aforementioned LCD device 10 described through FIGS. 1 to 4 in the degree to which the fourth boundary lines MRa-3, MRb-3 between the central portions 186a-3, 186b-3 are inclined with respect to the first direction (e.g., X-direction), and in the degree to which a connecting line Ba between one end of the stem portion 184a-3 and the other end of the first central portion 186a-3 is inclined with respect to the first direction (e.g., X-direction), and other configurations are identical or similar. Hereinafter, differences except for the repeated portions will be mainly described.

In the exemplary embodiment, the pixel electrode 182 (refer to FIG. 1) includes the stem portions 184a-3, 184b-3, 184c-3 and 184d-3 and the central portions 186a-3, 186b-3, 186c-3 and 186d-3.

In the exemplary embodiment, the extension direction of a connecting line Ba-3 between one end of the first stem portion 184*a*-3 and the other end of the first central portion 186*a*-3 may be substantially the same as the first direction (e.g., X-direction). That is, the degree to which the connecting line Ba-3 is inclined with respect to the first direction (e.g., X-direction) may be substantially 0 degree.

In addition, the description of the stem portions 184*a*, 184*b*, 184*c* and 184*d* described through FIGS. 1 to 4 may be substantially equally applied to the stem portions 184*a*-3, 184*b*-3, 184*c*-3 and 184*d*-3. That is, the description of the stem portions 184*a*, 184*b*, 184*c* and 184*d* described through FIGS. 1 to 4 may be substantially equally applied to the description of the boundary lines SLa-3, SRa-3, SLb-3 and SRb-3 of the stem portion 184*a*-3, 184*b*-3, 184*c*-3 and 184*d*-3, the center lines SCa-3, SCb-3, the regions SOa-3, SOb-3 spaced in the first direction (e.g., X-direction) between the stem portions 184*a*-3, 184*b*-3, 184*c*-3 and 184*d*-3, and the center lines SOa-3, SOb-3 of the spaced regions OCa-3, OCb-3.

The central portions 186*a*-3, 186*b*-3, 186*c*-3 and 186*d*-3 in the exemplary embodiment of FIG. 7 include a first central portion 186*a*-3, a second central portion 186*b*-3, a third central portion 186*c*-3 and a fourth central portion 186*d*-3.

The first central portion 186*a*-3 may include a third boundary line MLa-3 connected to the first boundary line SLa-3, and a fourth boundary line MRa-3 connected to the second boundary line SRa-3. The length of the third boundary line MLa-3 and the length of the fourth boundary line MRa-3 may be different from each other. In an exemplary embodiment, as in the exemplary embodiment of FIG. 7, the length of the third boundary line MLa-3 may be shorter than the length of the fourth boundary line MRa-3, for example.

In exemplary embodiments, the first central portion 186*a*-3 may be achieved by a structure in which a line width in the first direction (e.g., X-direction) decreases as it is closer to the reference line RL. In an exemplary embodiment, as in the exemplary embodiment of FIG. 7, the first central portion 186*a*-3 may have the maximum line width W2-3 in the first direction (e.g., X-direction) at the other end contacting the first stem portion 184*a*-3, and the line width W2-3 gradually decreases as it is closer to the reference line RL, and may have the minimum value at one end contacting the reference line RL, for example. The maximum line width W2-3 of the first central portion 186*a*-3 may be substantially identical to the line width W1-3 of the first stem portion 184*a*-3. In this case, the first central portion 186*a*-3 may be achieved in a shape in which the third boundary line MLa-3 is inclined at the second oblique angle a2 with respect to the first direction (e.g., X-direction), and in a shape in which the fourth boundary line MRa-3 is inclined at the seventh oblique angle a7 with respect to the first direction (e.g., X-direction), and the center line MCa-3 may be achieved in a shape of being inclined at the sixth oblique angle a6 with respect to the first direction (e.g., X-direction). At this time, the second oblique angle a2 may be greater than the sixth oblique angle a6, and the sixth oblique angle a6 may be greater than the seventh oblique angle a7.

The description of the first central portion 186*a*-3 may also be substantially equally applied to the second central portion 186*b*-3, the third central portion 186*c*-3 and the fourth central portion 186*d*-3.

In exemplary embodiments, the spaced region MOa-3 between the first central portion 186*a*-3 and the third central portion 186*c*-3 may be achieved by a structure in which the line width in the first direction (e.g., X-direction) increases as it is closer to the reference line RL. In an exemplary embodiment, as in the exemplary embodiment of FIG. 8, the line width W4-3 in the first direction (e.g., X-direction) of the spaced region MOa-3 may be minimum at the other end contacting the spaced region SOa-3 between the first stem portion 184*a*-3 and the third stem portion 184*c*-3, and the line width W4-3 gradually increases as it is closer to the reference line RL, and the line width may be maximum at one end contacting the reference line RL, for example. The maximum line width of the spaced region MOa-3 may be greater than or equal to the line width W3-3 in the first direction (e.g., X-direction) of the spaced region SOa-3 between the first stem portion 184*a*-3 and the third stem portion 184*c*-3. In this case, the center line CCa-3 may be achieved in a shape that is inclined at an eighth oblique angle a8 with respect to the first direction (e.g., X-direction), and the eighth oblique angle a8 may be smaller than the second oblique angle a2.

Description of the spaced region MOa-3 between the first central portion 186*a*-3 and the third central portion 186*c*-3 may also be substantially equally applied to the spaced region MOb-3 between the second central portion 186*b*-3 and the fourth central portion 186*d*-3.

As described above, as the line width in the first direction (e.g., X-direction) between the central portions 186*a*-3, 186*b*-3, 186*c*-3 and 186*d*-3 is achieved by a structure in which the line width decreases as it is closer to the reference line RL, as compared to a structure in which the line width of the central portion is the same as the line width of the stem portion, it is possible to secure the vertical separation distance between the central portions adjacent to each other in the first direction (e.g., X-direction), and the degree of short-circuit failure occurring between the central portions may be alleviated.

As described above, since the line width in the first direction (e.g., X-direction) of the spaced regions MOa-3, MOb-3 between the central portions 186*a*-3, 186*b*-3, 186*c*-3 and 186*d*-3 is achieved by a structure in which the line width increases as it is closer to the reference line RL, as compared to a structure in which the line width of the spaced region between the central portions is smaller than the spaced region between the stem portions, the degree of short-circuit failure occurring between the central portions may be alleviated.

Figure 9:
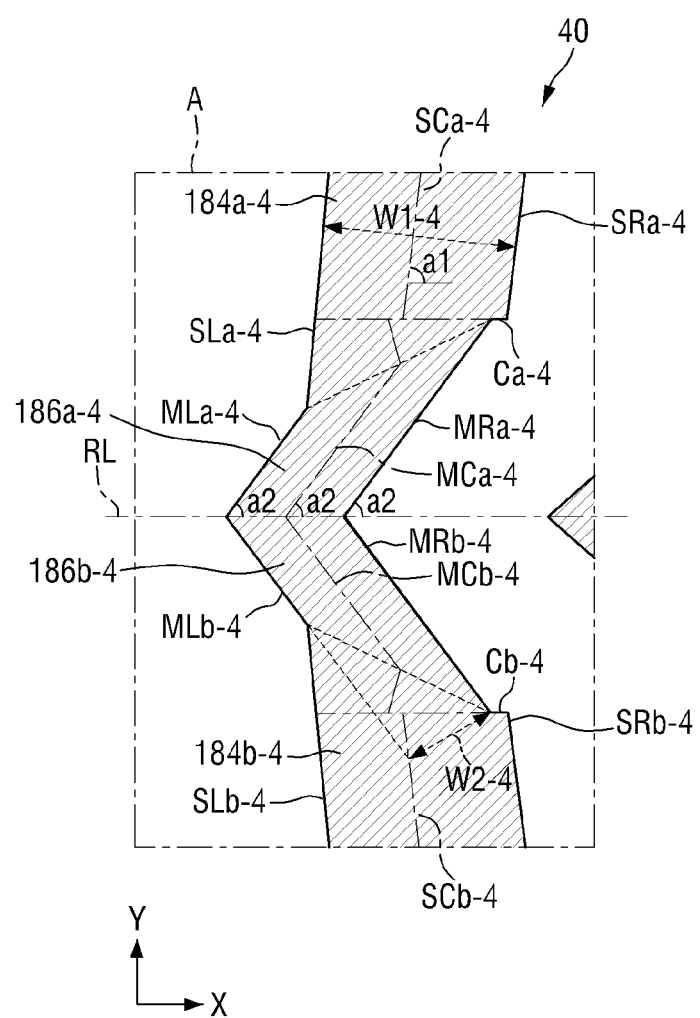
Figure 10:
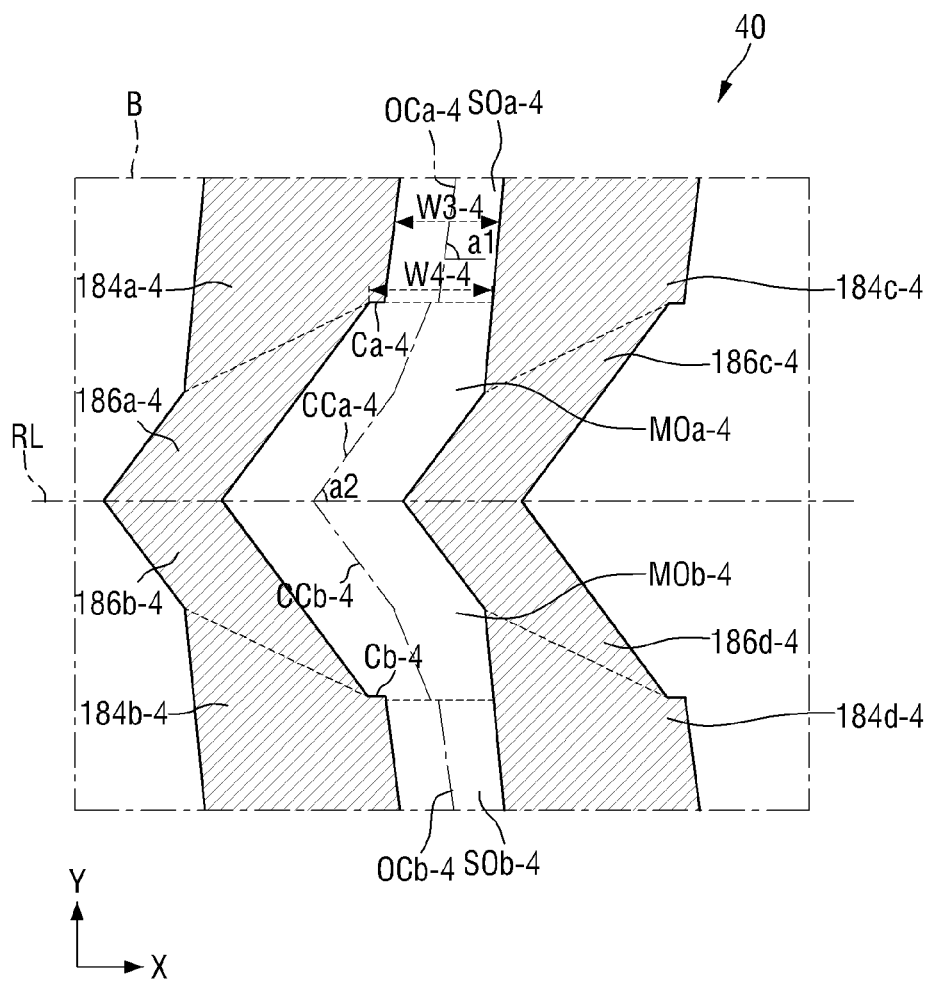

FIG. 9 is an enlarged plan view of a region corresponding to the region A of FIG. 1 of an LCD device according to another embodiment of the invention. FIG. 10 is an enlarged plan view of a region corresponding to the region B of FIG. 1 of an LCD device according to another embodiment of the invention.

Referring to FIGS. 9 and 10, an LCD device 40 according to another embodiment of the invention is different from the aforementioned LCD device 10 described through FIGS. 1 to 4 in a structure in which the central portions 186*a*-4, 186*b*-4 extend form a part of one ends of the stem portions 184*a*-4, 184*b*-4, and other configurations are identical or similar. Hereinafter, differences except for the repeated portions will be mainly described.

The pixel electrode 182 (refer to FIG. 1) in the exemplary embodiment includes the stem portions 184*a*-4, 184*b*-4, 184*c*-4 and 184*d*-4 and the central portions 186*a*-4, 186*b*-4, 186*c*-4 and 186*d*-4.

The description of the stem portions 184*a*, 184*b*, 184*c* and 184*d* described through FIGS. 1 to 4 may be substantially equally applied to the stem portions 184*a*-4, 184*b*-4, 184*c*-4 and 184*d*-4 in the exemplary embodiment. That is, the description of the stem portions 184*a*, 184*b*, 184*c* and 184*d* described through FIGS. 1 to 4 may be substantially equally applied to the description of the boundary lines SLa-4, SRa-4, SLb-4 and SRb-4 of the stem portion 184a-4, 184b-4, 184c-4 and 184d-4, the center lines SCa-4, SCb-4, the regions SOa-4, SOb-4 spaced in the first direction (e.g., X-direction) between the stem portions 184a-4, 184b-4, 184c-4 and 184d-4, and the center lines SOa-4, SOb-4 of the spaced regions OCa-4, OCb-4.

In the exemplary embodiment, the central portions 186a-4, 186b-4, 186c-4 and 186d-4 include the first central portion 186a-4, the second central portion 186b-4, the third central portion 186c-4 and the fourth central portion 186d-4.

In exemplary embodiments, the first central portion 186a-4 may be achieved by a structure that extends form a part of one end of the first stem portion 184a-4. In an exemplary embodiment, as in the exemplary embodiment of FIG. 9, the first central portion 186a-4 includes a third boundary line MLa-4 and a fourth boundary line MRa-4, and the other end of the third boundary line MLa-4 is connected to one end of the first boundary line SLa-4, but the other end of the fourth boundary line MRa-4 may be located inside the one end of the first stem portion 184a-4, for example. That is, the fourth boundary line MRa-4 may be achieved in a shape that is disconnected from the second boundary line SRa-4. Thus, a step Ca-4 may be provided at the boundary between the first stem portion 184a-4 and the first central portion 186a-4. A step Cb-4 may be substantially similar to the step Ca-4.

In exemplary embodiments, the first central portion 186a-4 may have a constant line width W2-4. That is, the third boundary line MLa-4 and the fourth boundary line MRa-4 may have the same degree of being inclined with respect to the first direction (e.g., X-direction) at an oblique angle a2. That is, the third boundary line MLa-4 and the fourth boundary line MRa-4 may be parallel to each other. However, this is an example and is not limited thereto.

In the exemplary embodiment of FIG. 9, due to the step Ca-4 provided at the boundary between the first stem portion 184a-4 and the first central portion 186a-4, the line width W2-4 of the first central portion 186a-4 may be smaller than the line width W1-4 of the first stem portion 184a-4.

In the exemplary embodiment of FIG. 9, due to the step Ca-4 provided at the boundary between the first stem portion 184a-4 and the first central portion 186a-4, the center line SCa-4 of the first stem portion 184a-4 may be achieved in a disconnected shape.

The description of the first central portion 186a-4 may also be substantially similarly applied to the second central portion 186b-4, the third central portion 186c-4 and the fourth central portion 186d-4.

Referring to FIG. 10, the minimum line width W4-4 of the spaced region MOa-4 between the first central portion 186a-4 and the third central portion 186c-4 may be greater than the line width W3-4 of the spaced region SOa-4 between the first stem portion 184a-4 and the third stem portion 184c-4.

Description of the spaced region MOa-4 between the first central portion 186a-4 and the third central portion 186c-4 may also be substantially equally applied to the spaced region MOb-4 between the third central portion 186b-4 and the fourth central portion 186d-4.

As described above, since the line width W2-4 between the central portions 186a-4, 186b-4, 186c-4 and 186d-4 are achieved in a structure smaller than the line width W1-4 of the stem portions 184a-4, 184b-4, 184c-4 and 184d-4, as compared to a structure in which the line width of the central portion is the same as the line width of the stem portion, it is possible to secure the vertical separation space between the central portions adjacent to each other in the first direction (e.g., X-direction), and the degree of short-circuit failure occurring between the central portions may be alleviated.

As described above, since the minimum line width W4-4 in the first direction (e.g., X-direction) of the spaced regions MOa-4, MOb-4 between the central portions 186a-4, 186b-4, 186c-4 and 186d-4 is achieved by a structure greater than the line width W3-4 in the first direction (e.g., X-direction) of the spaced regions SOa-4, SOb-4 between the stem portions 184a-4, 184b-4, 184c-4 and 184d-4, as compared to a structure in which the line width of the spaced region between the central portions is smaller than the line width of the spaced regions between the stem portions, the degree of short-circuit failure occurring at the central portion may be alleviated. The center line CCa-4 or CCb-4 may be achieved in a shape that is inclined at a second oblique angle a2 with respect to the first direction (e.g., X-direction).

Figure 11:
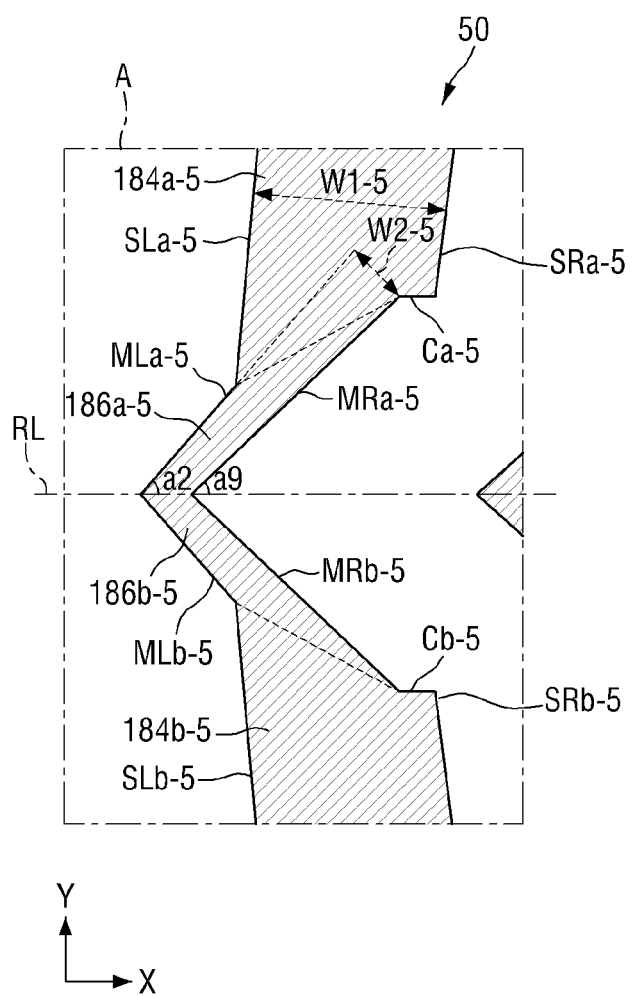
Figure 12:
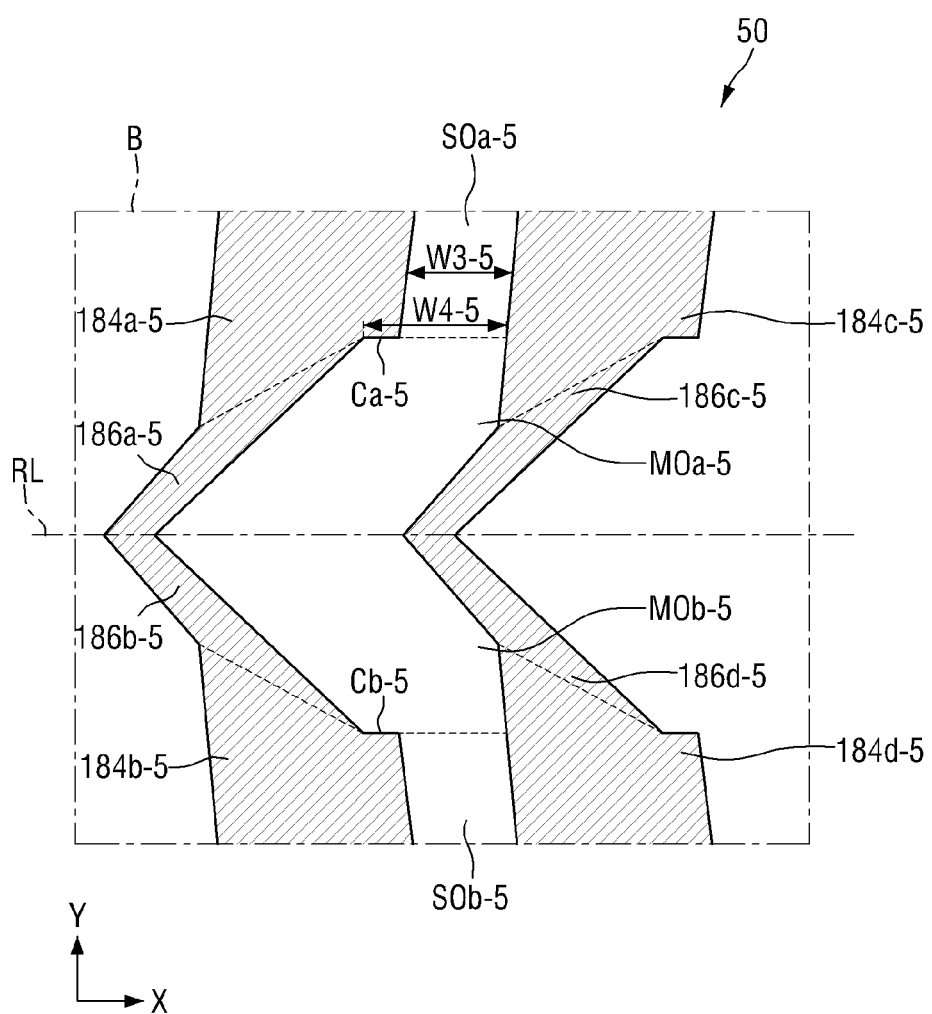

FIG. 11 is an enlarged plan view of a region corresponding to the region A of FIG. 1 of an LCD device according to another embodiment of the invention. FIG. 12 is an enlarged plan view of a region corresponding to the region B of FIG. 1 of an LCD device according to another embodiment of the invention.

Referring to FIGS. 11 and 12, an LCD device 50 according to another embodiment of the invention is different from the LCD device 40 described above through FIGS. 8 and 10 in the degree to which the fourth boundary lines MRa-5, MRb-5 between the central portions 186a-5, 186b-5 are inclined with respect to the first direction (e.g., X-direction), and other structures are identical or similar. Hereinafter, difference except for the repeated portions will be mainly described.

The pixel electrode 182 (refer to FIG. 1) in the exemplary embodiment includes the stem portions 184a-5, 184b-5, 184c-5 and 184d-5 and the central portions 186a-5, 186b-5, 186c-5 and 186d-5.

The description of the stem portions 184a-4, 184b-4, 184c-4 and 184d-4 described through FIGS. 9 to 10 may be substantially equally applied to the stem portions 184a-5, 184b-5, 184c-5 and 184d-5 in the exemplary embodiment. Steps Ca-5 and Cb-5 may be substantially similar to steps Ca-4 and Cb-4 shown in FIG. 9.

The central portions 186a-5, 186b-5, 186c-5 and 186d-5 in the exemplary embodiment include the first central portion 186a-5, the second central portion 186b-5, the third central portion 186c-5 and the fourth central portion 186d-5.

The first central portion 186a-5 may include a third boundary line MLa-5 connected to the first boundary line SLa-5, and a fourth boundary line MRa-5 connected to the second boundary line SRa-5.

The first central portion 186a-5 may be achieved by a structure in which the line width decreases as it is closer to the reference line RL. In an exemplary embodiment, as in the exemplary embodiment of FIG. 5, the first central portion 186a-5 may have the maximum line width W2-5 at the other end contacting the other end of the first stem portion 184a-5, and the line width W2-5 gradually decreases as it is closer to the reference line RL and may be minimum at one end contacting the reference line RL, for example. The maximum line width W2-5 of the first central portion 186a-5 may be smaller than the line width W1-5 of the first stem portion 184a-5. In this case, the first central portion 186a-5 may be achieved in a shape in which the third boundary line MLa-5 is inclined at a second oblique angle a2 with respect to the first direction (e.g., X-direction) and in a shape in which the fourth boundary line MRa-5 is inclined at an oblique angle a9 with respect to the first direction (e.g., X-direction). At this time, the ninth oblique angle a9 may be smaller than the second oblique angle a2.

The description of the first central portion 186a-5 may also be substantially equally applied to the second central portion 186b-5, the third central portion 186c-5 and the fourth central portion 186d-5.

In exemplary embodiments, the spaced region MOa-5 between the first central portion 186a-5 and the third central portion 186c-5 may be achieved by a structure in which the line width increases as it is closer to the reference line RL. In an exemplary embodiment, as in the exemplary embodiment of FIG. 12, the line width W4-5 of the spaced region MOa-5 may be minimum at the other end contacting the spaced region SOa-5 between the first stem portion 184a-5 and the third stem portion 184c-5, and the line width W4-5 gradually increases as it is closer to the reference line RL, and the line width may be maximum at one end contacting the reference line RL, for example. At this time, the degree of increase in the line width W4-5 may not be constant. The minimum line width W4-5 of the spaced region MOa-5 may be greater than the line width W3-5 of the spaced region SOa-5 between the first stem portion 184a-5 and the third stem portion 184c-5.

The description of the spaced region MOa-5 between the first central portion 186a-5 and the third central portion 186c-5 may also be substantially equally applied to the spaced region MOb-5 between the second central portion 186b-5 and the fourth central portion 186d-5.

As described above, as the line width W4-5 between the central portions 186a-5, 186b-5, 186c-5 and 186d-5 is achieved by a structure in which the line width decreases as it is closer to the reference line RL, as compared to a structure in which the line width of the central portion is the same as the line width of the stem portion, it is possible to secure the separation distance between the central portions adjacent to each other in the first direction (e.g., X-direction), and the degree of short-circuit failure occurring between the central portions may be alleviated.

As described above, since the line width W4-5 of the spaced regions MOa-5, MOb-5 between the central portions 186a-5, 186b-5, 186c-5 and 186d-5 is achieved by a structure in which the line width increases as it is closer to the reference line RL, as compared to a structure in which the line width of the spaced region between the central portions is smaller than the spaced region between the stem portions, the degree of short-circuit failure occurring between the central portions may be alleviated.

Figure 13:
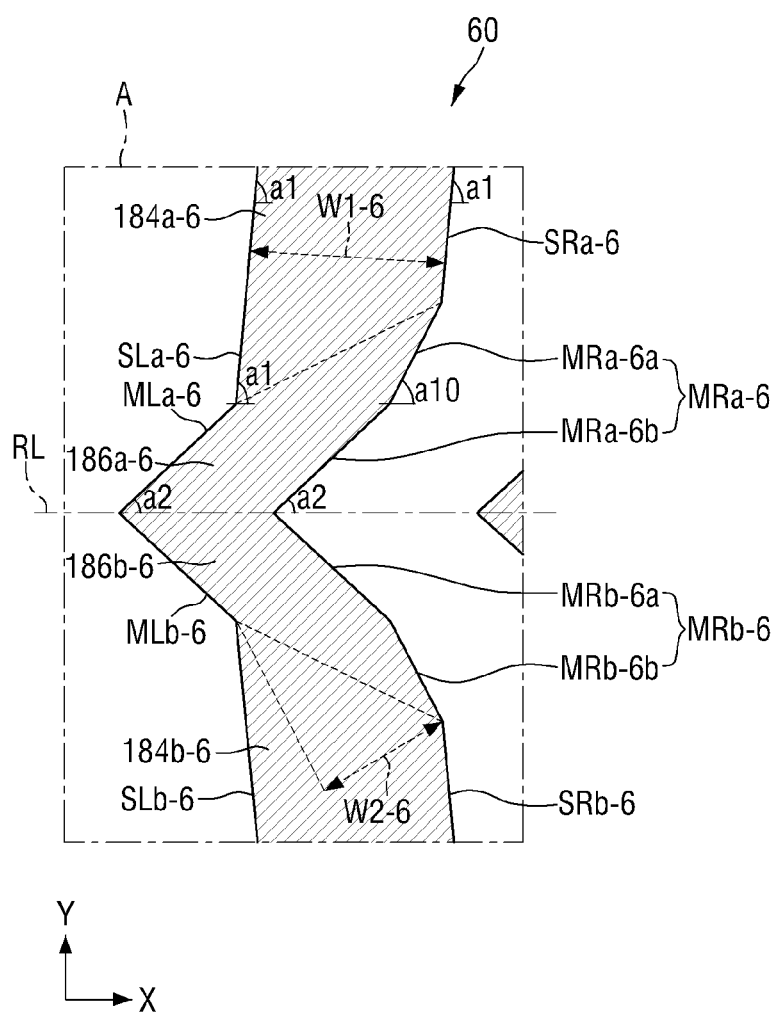
Figure 14:
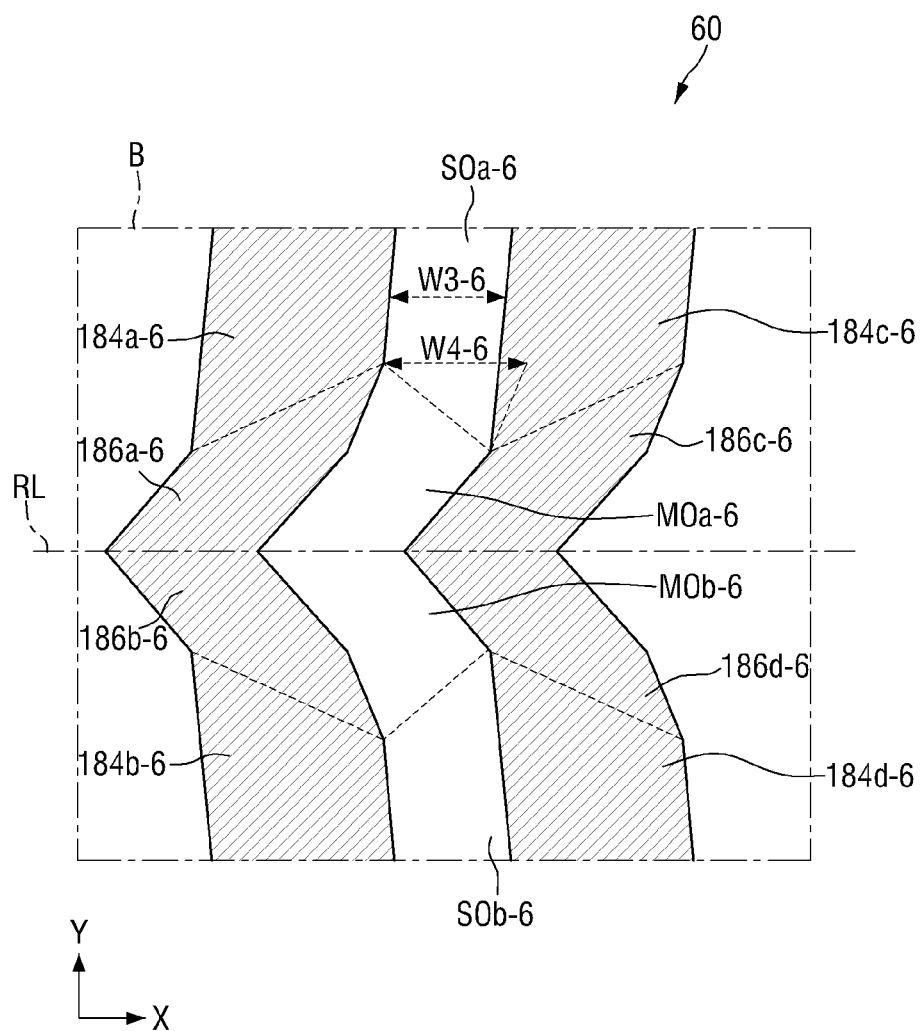

FIG. 13 is an enlarged plan view of a region corresponding to the region A of FIG. 1 of an LCD device according to another embodiment of the invention. FIG. 14 is an enlarged plan view of a region corresponding to the region B of FIG. 1 of an LCD device according to another embodiment of the invention.

Referring to FIGS. 13 and 14, an LCD device 60 according to another embodiment of the invention is different from the aforementioned LCD device 10 described through FIGS. 1 to 4 in fourth boundary lines MRa-6a, MRa-6b, MRb-6a and MRb-6b between the central portions 186a-6, 186b-6, and other configurations are identical or similar. Hereinafter, differences except for the repeated portions will be mainly described.

The pixel electrode 182 (refer to FIG. 1) in the exemplary embodiment includes the stem portions 184a-6, 184b-6, 184c-6 and 184d-6 and the central portions 186a-6, 186b-6, 186c-6 and 186d-6.

The description of the stem portions 184a, 184b, 184c and 184d described through FIGS. 1 to 4 may be substantially equally applied to the stem portions 184a-6, 184b-6, 184c-6 and 184d-6 in the exemplary embodiment.

In the exemplary embodiment, the central portions 186a-6, 186b-6, 186c-6 and 186d-6 include the first central portion 186a-6, the second central portion 186b-6, the third central portion 186c-6 and the fourth central portion 186d-6.

The first central portion 186a-6 may include a third boundary line MLa-6 connected to the first boundary line SLa-6, and fourth boundary lines MRa-6a, MRa-6b connected to the second boundary line SRa-6.

The fourth boundary lines MRa-6a, MRa-6b include a 4-1 boundary line MRa-6a and a 4-2 boundary line MRa-6b.

One end of the 4-1 boundary line MRa-6a is connected to the other end of the 4-2 boundary line MRa-6b, and the other end of the 4-1 boundary line MRa-6a is connected to one end of the second boundary line SRa-6. One end of the 4-2 boundary line MRa-6b is connected to the reference line RL, and the other end of the 4-2 boundary line MRa-6b is connected to one end of the first 4-1 boundary line MRa-6a.

The degree of the 4-1 boundary line MRa-6a inclined with respect to the first direction (e.g., X-direction) may be a tenth oblique angle a10, and the degree of the 4-2 boundary line MRa-6b inclined with respect to the first direction (e.g., X-direction) may be a second oblique angle a2. The tenth oblique angle a10 may be larger than the second oblique angle a2. The tenth oblique angle a10 may be smaller than the first oblique angle a1.

Thus, the first central portion 186a-6 may have the maximum line width W2-6 at the other end contacting the first stem portion 184a-6. The maximum line width W2-6 of the first central portion 186a-6 may be smaller than or equal to the line width W1-6 of the first stem portion 184a-6. The line width W2-6 at the 4-1 boundary line MRa-6a of the first central portion 186a-6 may have a structure in which the line width gradually decreases as it is closer to the reference line RL, and the line width W2-6 at the 4-2 boundary line MRa-6b of the first central portion 186a-6 may be constant. However, this is an example, and in other embodiments, the line width W2-6 at the 4-2 boundary line MRa-6b of the first central portion 186a-6 may also be achieved by a structure in which the line width gradually decreases as it is closer to the reference line RL. In this case, the degree of the 4-2 first boundary line MRa-6b inclined with respect to the first direction (e.g., X-direction) may be smaller than the second oblique angle a2.

The description of the first central portion 186a-6 may also be substantially similarly applied to the second central portion 186b-6, the third central portion 186c-6 and the fourth central portion 186d-6.

Referring to FIG. 14, the spaced region MOa-6 between the first central portion 186a-6 and the third central portion 186c-6 may have the minimum line width W4-6 at the other end contacting the spaced region SOa-6 between the first stem portion 184a-6 and the third stem portions 184c-6. The minimum line width W4-6 of the spaced region MOa-6 may be greater than the line width W3-6 of the spaced region SOa-6.

The description of the spaced region MOb-6 between the first central portion 186a-6 and the third central portion 186c-6 may also be substantially equally applied to the spaced region MOb-6 between the second central portion 186b-6 and the fourth central portion 186d-6.

As described above, since the line width W2-6 between the central portions 186a-6, 186b-6, 186c-6 and 186d-6 are achieved by a structure smaller than the line width W1-6 of the stem portions 184a-6, 184b-6, 184c-6 and 184d-6, as compared to a structure in which the line width of the central portion is the same as the line width of the stem portion, it is possible to secure the vertical separation space between the central portions adjacent to each other in the first direction (e.g., X-direction), and the degree of short-circuit failure occurring between the central portions may be alleviated.

As described above, since the minimum line width W4-6 in the first direction (e.g., X-direction) of the spaced regions MOa-6, MOb-6 between the central portions 186a-6, 186b-6, 186c-6 and 186d-6 is achieved by a structure greater than the line width W3-6 in the first direction (e.g., X-direction) of the spaced regions SOa-6, SOb-6 between the stem portions 184a-6, 184b-6, 184c-6 and 184d-6, as compared to a structure in which the line width of the spaced region between the central portions is smaller than the line width of the spaced regions between the stem portions, the degree of short-circuit failure occurring at the central portion may be alleviated.

Figure 15:
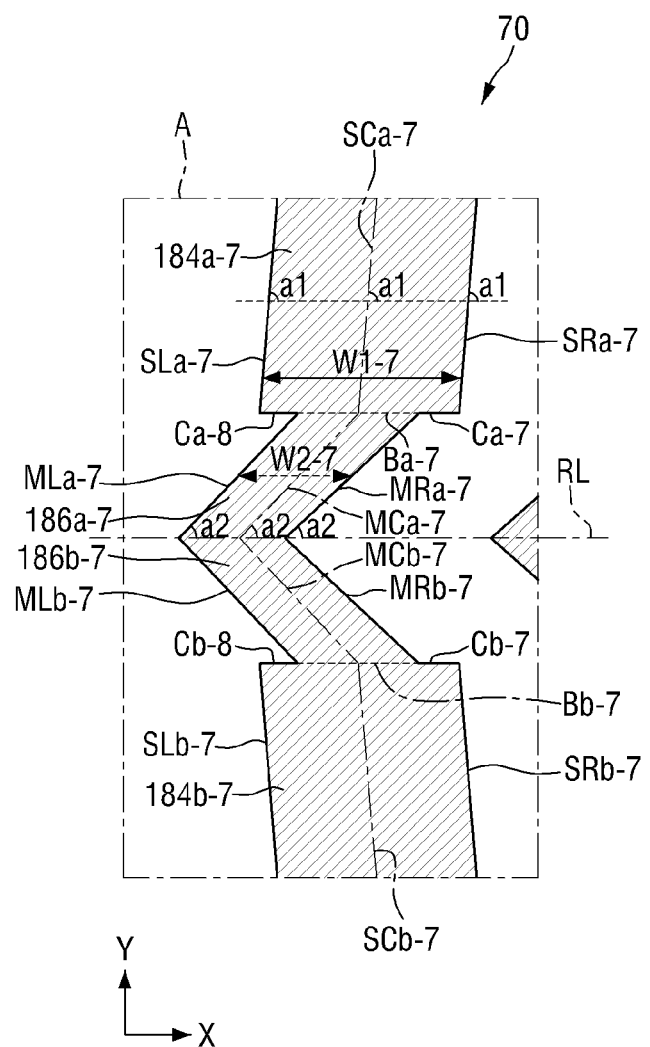
Figure 16:
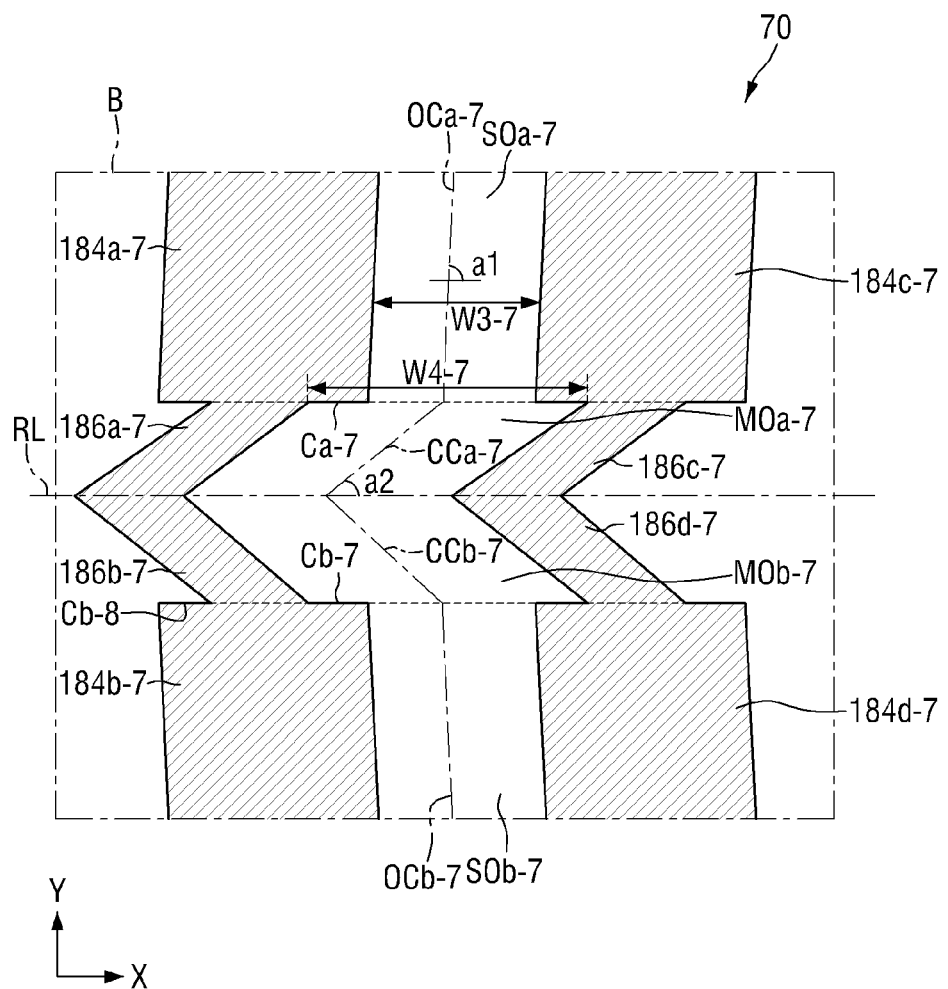

FIG. 15 is an enlarged plan view of a region corresponding to the region A of FIG. 1 of an LCD device according to another embodiment of the invention. FIG. 16 is an enlarged plan view of a region corresponding to the region B of FIG. 1 of an LCD device according to another embodiment of the invention.

Referring to FIGS. 15 and 16, an LCD device 70 according to another embodiment of the invention is different from the LCD device 10 described above through FIGS. 1 to 4 in the configuration of steps Ca-7, Ca-8, Cb-7 and Cb-8 provided at the boundary region between the stem portions 184a-7, 184b-7 and the central portions 186a-7, 186b-7, and other structures are identical or similar. Hereinafter, difference except for the repeated portions will be mainly described.

The pixel electrode 182 (refer to FIG. 1) in the exemplary embodiment includes the stem portions 184a-7, 184b-7, 184c-7 and 184d-7 and the central portions 186a-7, 186b-7, 186c-7 and 186d-7.

The description of the stem portions 184a, 184b, 184c and 184d described through FIGS. 1 to 4 may be substantially equally applied to the stem portions 184a-7, 184b-7, 184c-7 and 184d-7 in the exemplary embodiment.

The central portions 186a-7, 186b-7, 186c-7 and 186d-7 in the exemplary embodiment include the first central portion 186a-7, the second central portion 186b-7, the third central portion 186c-7 and the fourth central portion 186d-7.

In exemplary embodiments, the first central portion 186a-7 may be achieved by a structure that extends form a part of one end of the first stem portion 184a-7. In an exemplary embodiment, as in the exemplary embodiment of FIG. 15, the first central portion 186a-7 includes a third boundary line MLa-7 and a fourth boundary line MRa-7, and the other ends of the third boundary line MLa-7 and the fourth boundary line MRa-7 may be located inside the one end of the first stem portion 184a-7, for example. Thus, a first step Ca-7 and a second step Ca-8 may be provided at the boundary between the first stem portion 184a-7 and the first central portion 186a-7. That is, the first central portion 186a-7 may have a structure that extends from the inside of one end of the first stem portion 184a-7.

In exemplary embodiments, the width of the first step Ca-7 and the width of the second step Ca-8 may be identical to each other. In this case, the center line SCa-7 of the first stem portion 184a-7 and the center line MCa-7 of the first central portion 186a-7 may be connected to each other. However, this is an example, and the width of the first step Ca-7 and the second step Ca-8 may also be differently achieved.

In exemplary embodiments, the first step Ca-7 and the second step Ca-8 may have a shape that substantially extends in the first direction (e.g., X-direction). A connecting line Ba-7 between one end of the first stem portion 184a-7 and the other end of the first central portion 186a-7 may have a shape that extends in the first direction (e.g., X-direction). However, this is an example, and the first step Ca-7, the second step Ca-8 and the connecting line Ba-7 may, of course, be achieved in a shape that is inclined at a predetermined angle with respect to the first direction (e.g., X-direction). A connecting line Bb-7 may be substantially similar to the connecting line Ba-7.

In exemplary embodiments, the first central portion 186a-7 may have a constant line width W2-7 in the first direction (e.g., X-direction). That is, the third boundary line MLa-7 and the fourth boundary line MRa-7 may have the same degree of inclination with respect to the first direction (e.g., X-direction) at the oblique angle a2. That is, the third boundary line MLa-7 and the fourth boundary line MRa-7 may be parallel to each other. However, this is an example and is not limited thereto. In another embodiment, the degree of the third boundary line MLa-7 inclined with respect to the first direction (e.g., X-direction) may be greater than the degree of the fourth boundary line MRa-7 inclined with respect to the first direction (e.g., X-direction).

In the exemplary embodiment of FIG. 15, due to the steps Ca-7, Ca-8 provided at the boundary between the first stem portion 184a-7 and the first central portion 186a-7, the line width W2-7 in the first direction (e.g., X-direction) of the first central portion 186a-7 may be smaller than the line width W1-7 in the first direction (e.g., X-direction) of the first stem portion 184a-7.

In the exemplary embodiment of FIG. 15, due to the steps Ca-7 and Ca-8 provided at the boundary between the first stem portion 184a-7 and the first central portion 186a-7, the center line SCa-7 of the first stem portion 184a-7 may be achieved in a disconnected shape.

The description of the first central portion 186a-7 may also be substantially similarly applied to the second central portion 186b-7, the third central portion 186c-7 and the fourth central portion 186d-7.

Referring to FIG. 16, the line width W4-7 in the first direction (e.g., X-direction) of the spaced region MOa-7 between the first central portion 186a-7 and the third central portion 186c-7 may be greater than the line width W3-7 in the first direction (e.g., X-direction) of the spaced region SOa-7 between the first stem portion 184a-7 and the third stem portion 184c-7.

The description of the spaced region MOa-7 between the first central portion 186a-7 and the third central portion 186c-7 may also be substantially equally applied to the spaced region MOb-7 between the third central portion 186b-7 and the fourth central portion 186d-7. The center line CCa-7 or CCb-7 may be achieved in a shape that is inclined at a second oblique angle a2 with respect to the first direction (e.g., X-direction).

As described above, since the line width W2-7 in the first direction (e.g., X-direction) of the central portions 186a-7, 186b-7, 186c-7 and 186d-7 is achieved in the structure smaller than the line width W1-7 in the first direction (e.g., X-direction) of the stem portions 184a-7, 184b-7, 184c-7 and 184d-7, as compared to a structure in which the line width of the central portion is the same as the line width of the stem portion, it is possible to secure the vertical separation space between the central portions adjacent to each other in the first direction (e.g., X-direction), and the degree of short-circuit failure occurring between the central portions may be alleviated.

As described above, since the line width W4-7 in the first direction (e.g., X-direction) of the spaced regions MOa-7, MOb-7 between the central portions 186a-7, 186b-7, 186c-7 and 186d-7 is achieved by a structure greater than the line width W3-7 in the first direction (e.g., X-direction) of the spaced regions SOa-7, SOb-7 between the stem portions 184a-7, 184b-7, 184c-7 and 184d-7, as compared to a structure in which the line width of the spaced region between the central portions is smaller than the line width of the spaced regions between the stem portions, the degree of short-circuit failure occurring at the central portion may be alleviated.

Figure 17:
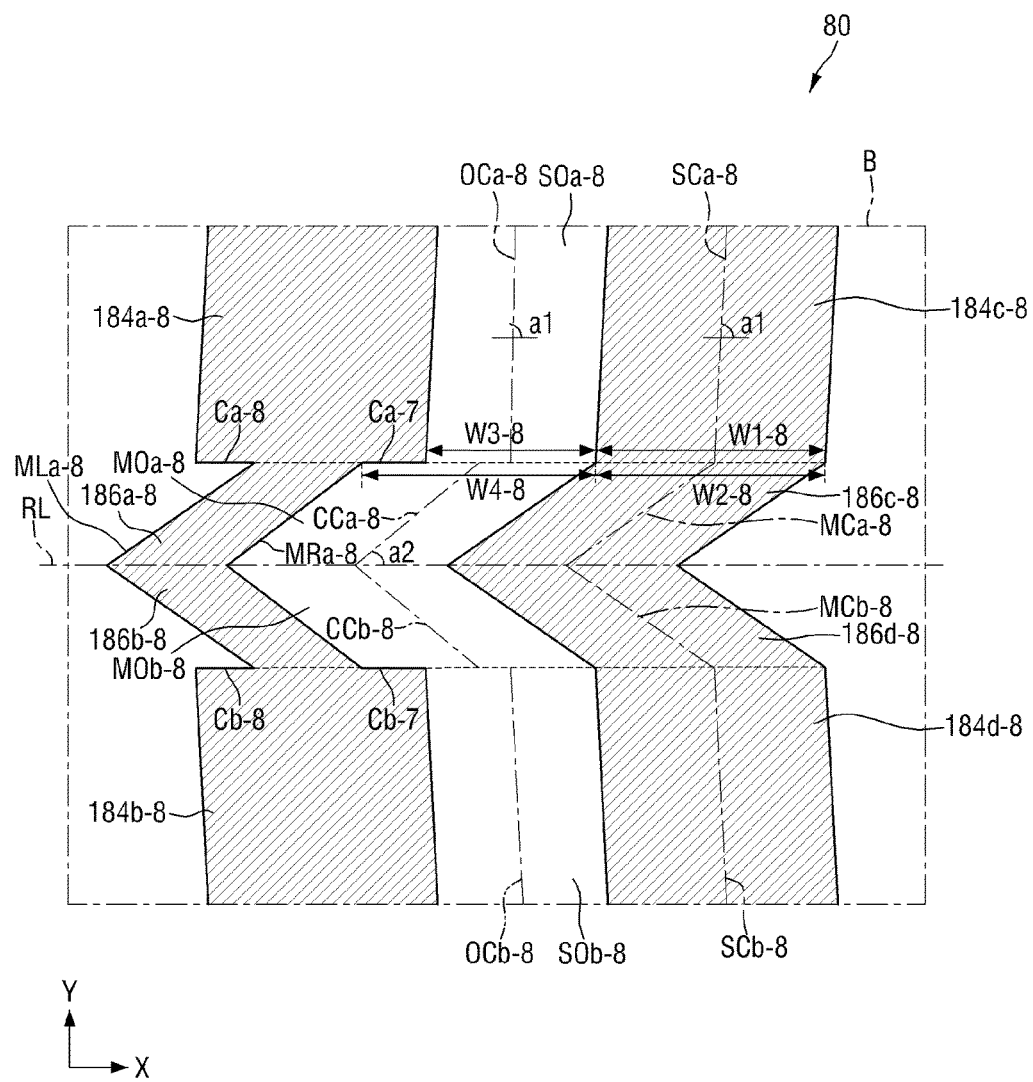
Figure 18:
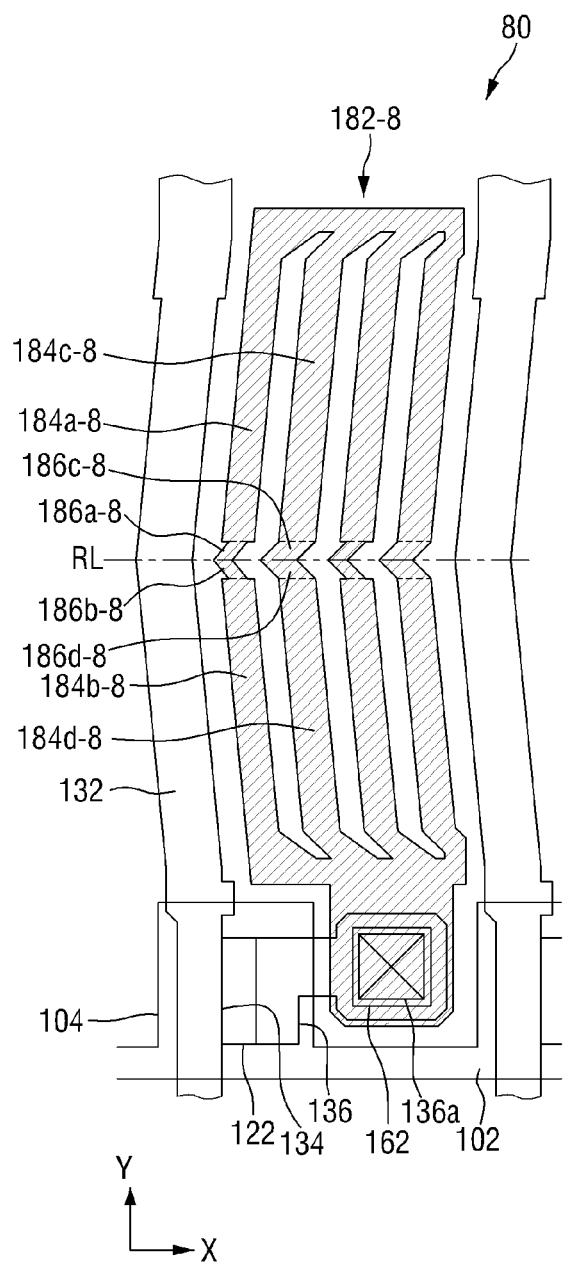
FIG. 18 is a plan view of another embodiment of an LCD device according to the invention.

FIG. 17 is an enlarged plan view of a region corresponding to the region B of FIG. 1 of an LCD device according to another embodiment of the invention. FIG. 18 is a plan diagram of an LCD device according to another embodiment of the invention.

Referring to FIGS. 17 and 18, an LCD device 80 according to another embodiment of the invention is different from the LCD device 10 described above through FIGS. 1 to 4 and the LCD device 70 described above through FIGS. 15 and 16 in the configurations of the third stem portion 186c-8 and the fourth stem portion 186d-8, and other structures are identical or similar. Hereinafter, difference except for the repeated portions will be mainly described.

The pixel electrode 182-8 in the exemplary embodiment includes the stem portions 184a-8, 184b-8, 184c-8 and 184d-8 and the central portions 186a-8, 186b-8, 186c-8 and 186d-8.

The description of the stem portions 184a, 184b, 184c and 184d described through FIGS. 1 to 4 may be substantially equally applied to the stem portions 184a-8, 184b-8, 184c-8 and 184d-8 in the exemplary embodiment.

The central portions 186a-8, 186b-8, 186c-8 and 186d-8 in the exemplary embodiment include the first central portion 186a-8, the second central portion 186b-8, the third central portion 186c-8 and the fourth central portion 186d-8.

The description of the first central portion 186a-7 and the second central portion 186b-7 described through FIGS. 15 and 16 may be substantially equally applied to the first central portion 186a-8 and the second central portion 186b-8.

The third central portion 186c-8 may have a shape that is symmetrical on the basis of the center line MCa-8 of the line width. Specifically, the third central portion 186c-8 has a constant line width W2-8 in the first direction (e.g., X-direction), and the shape of the left side in the drawings and the shape of the right side in the drawings may be the same on the basis of the center line MCa-8. The length of the third boundary line MLa-8 and the length of the fourth boundary line MRa-8 may be substantially the same. The degree of inclination of the third boundary line MLa-8, the fourth boundary line MRa-8 and the center line MCa-8 in the first direction (e.g., X-direction) may be the same at the second oblique angle a2.

The line width W2-8 in the first direction (e.g., X-direction) of the third central portion 186c-8 may be substantially the same as the line width W1-8 in the first direction (e.g., X-direction) of the third stem portion 184c-8.

The description of the third central portion 186c-8 may also be substantially equally applied to the fourth central portion 186d-8.

Referring to FIG. 17, the line width W4-8 in the first direction (e.g., X-direction) of the spaced region MOa-8 between the first central portion 186a-8 and the third central portion 186c-8 may be greater than the line width W3-8 in the first direction (e.g., X-direction) of the spaced region SOa-8 between the first stem portion 184a-8 and the third stem portion 184c-8.

The description of the spaced region MOa-8 between the first central portion 186a-8 and the third central portion 186c-8 may also be substantially equally applied to the spaced region MOb-8 between the third central portion 186b-8 and the fourth central portion 186d-8.

Referring to FIG. 18, in exemplary embodiments, the first central portion 186a-8 and the third central portion 186c-8 may be alternately disposed in the first direction (e.g., X-direction). The second central portion 186b-8 and the fourth central portion 186d-8 may be alternately disposed in the first direction (e.g., X-direction). Since the LCD device 80 includes the steps Ca-7, Ca-8, Cb-7 and Cb-8, even when the first central portion 186a-8, the second central portion 186b-8, the third central portion 186c-8 and the fourth central portion 186d-8 are alternately disposed as described above, the line width in the first direction (e.g., X-direction) of the spaced region between the central portions may be greater than the line width in the first direction (e.g., X-direction) of the spaced region between the stem portions. Accordingly, as compared to a structure in which the line width of the spaced region between the central portions is smaller than the spaced region between the stem portions, the degree of short-circuit failure occurring between the central portions may be alleviated.

However, the effects of the invention are not restricted to the one set forth herein. The above and other effects of the invention will become more apparent to one of daily skill in the art to which the invention pertains by referencing the claims.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:
1. A liquid crystal display device comprising:
   first and second substrates which face each other; and
   a pixel electrode which includes a first central portion and a first stem portion disposed on the first substrate and sequentially disposed on one side of a reference line extending in a first direction in a plan view, and a second central portion and a second stem portion sequentially disposed on the other side opposite to the one side of the reference line in the plan view,
   wherein the first stem portion extends at a first oblique angle in which a center line of a line width has a positive sign with respect to the first direction,
   the first central portion extends from one end of the first stem portion and has a shape in which a center line of a line width is inclined at a second oblique angle having a positive sign with respect to the first direction, and
   the line width of the first central portion is smaller than the line width of the first stem portion.

2. The liquid crystal display device of claim 1, wherein an absolute value of the first oblique angle is greater than an absolute value of the second oblique angle.

3. The liquid crystal display device of claim 1, wherein the second stem portion extends at a third oblique angle in which a center line of its line width has a negative sign with respect to the first direction,
   the second central portion extends from one end of the second stem portion and has a shape in which a center line of a line width is inclined at a fourth oblique angle having a negative sign with respect to the first direction, and
   the line width of the second central portion is smaller than the line width of the second stem portion.

4. The liquid crystal display device of claim 3, wherein an absolute value of the first oblique angle and an absolute value of the third oblique angle are substantially the same,
   the absolute value of the second oblique angle and the absolute value of the fourth oblique angle are substantially the same, and
   the absolute values of the first oblique angle and the third oblique angle are greater than the absolute values of the second oblique angle and the fourth oblique angle.

5. The liquid crystal display device of claim 1, wherein the first central portion comprises one end contacting the reference line and the other end connected to the one end of the first stem portion, and
   the second central portion comprises one end contacting the reference line and the other end connected to one end of the second stem portion.

6. The liquid crystal display device of claim 5, wherein a center line of the first stem portion, a center line of the first central portion, a central portion of the second central portion and a center line of the second central portion are connected to one another.

7. The liquid crystal display device of claim 6, wherein the first stem portion and the second stem portion are symmetrical with respect to their dispositions to the reference line, and
   the first central portion and the second central portion are symmetrical with respect to their dispositions to the reference line.

8. The liquid crystal display device of claim 1, wherein the first stem portion comprises a first boundary line which defines one side boundary at the first oblique angle with respect to the first direction, and
   a second boundary line which defines the other side boundary opposite to the one side boundary at the first oblique angle with respect to the first direction, and
   the first central portion comprises:
   a third boundary line which is connected to the first boundary line, is inclined at a third oblique angle with respect to the first direction and extends to the reference line to form one side boundary, and
   a fourth boundary line which is connected to the second boundary line is inclined at a fourth oblique angle with respect to the first direction and extends to the reference line to form the other side boundary opposite to the one side boundary.

9. The liquid crystal display device of claim 8, wherein the length of the third boundary line is shorter than the length of the fourth boundary line.

10. The liquid crystal display device of claim 9, wherein absolute values of the second oblique angle, the third oblique angle and the fourth oblique angle are substantially the same.

11. The liquid crystal display device of claim 9, wherein an absolute value of the third oblique angle is greater than an absolute value of the second oblique angle, and the absolute value of the second oblique angle is greater than an absolute value of the fourth oblique angle.

12. The liquid crystal display device of claim 11, wherein a connecting line between the one end of the first stem portion and an other end of the first central portion has a degree of inclination not equal to 0 degree with respect to the first direction.

13. The liquid crystal display device of claim 1, wherein the first central portion extends from a part of the one end of the first stem portion, and
   the pixel electrode comprises a step which is provided at a boundary between the first central portion and the first stem portion.

14. The liquid crystal display device of claim 13, wherein the first central portion extends from an inside of the one end of the first stem portion.

15. The liquid crystal display device of claim 1, further comprising:
   a gate line which is disposed on the first substrate and extends in the first direction.

16. The liquid crystal display device of claim 1, wherein the first oblique angle is substantially 85 degrees.

17. A liquid crystal display device comprising:
   first and second substrates which face each other;
   a pixel electrode which includes a first stem portion, a first central portion, a second stem portion and a second central portion,
   the first stem portion being disposed on the first substrate and having, in a plan view, a center line of a line width with extending at a first oblique angle in a first direction,
   the first central portion extending from one end of the first stem portion and having, in the plan view, a center line of a line width inclined at a second oblique angle with respect to the first direction,
   the second stem portion spaced apart from the first stem portion to one side in the first direction, and having, in the plan view, a center line of a line width extending at the first oblique angle with respect to the first direction,
   the second central portion spaced apart, in the plan view, from the first central portion to one side in the first direction, extending from one end of the second stem portion, and having a center line of a line width with inclined at a second oblique angle with respect to the first direction, and
   the line width of a spaced region between the first central portion and the second central portion is greater than a line width of a spaced region between the first stem portion and the second stem portion.

18. The liquid crystal display device of claim 17, wherein the line width of the spaced region between the first stem portion and the second stem portion has a constant line width, and the spaced region between the first central portion and the second central portion has a constant line width.

19. The liquid crystal display device of claim 18, wherein a center line of the spaced region between the first stem portion and the second stem portion has a shape which is inclined at the first oblique angle with respect to the first direction, and
   a center line of the spaced region between the first central portion and the second central portion has a shape which is inclined at the second oblique angle with respect to the first direction.

20. The liquid crystal display device of claim 17, wherein the first central portion, the first stem portion, the second stem portion and the second central portion are disposed on one side of the reference line extending in the first direction, in a plan view, the first central portion comprises one end contacting the reference line and the other end connected to one end of the first stem portion, the second central portion comprises one end contacting the reference line, and the other end connected to one end of the second stem portion, and an absolute value of the first oblique angle is greater than an absolute value of the second oblique angle.

21. The liquid crystal display device of claim 20, wherein a spaced region between the first central portion and the second central portion has a line width which increases as it approaches the reference line.

22. The liquid crystal display device of claim 20, further comprising:

a third stem portion which is symmetrical to the first stem portion with respect to the reference line;

a third central portion which is symmetrical to the first central portion with respect to the reference line;

a fourth stem portions which is symmetrical to the second stem portion with respect to the reference line; and a fourth central portion which is symmetrical to the second central portion with respect to the reference line.

23. The liquid crystal display device of claim 20, wherein the first stem portion comprises:

a first boundary line which defines one side boundary at the first oblique angle with respect to the first direction, and a second boundary line which defines the other side boundary opposite to the one side boundary at the first oblique angle with respect to the first direction, the first central portion further comprises:

a third boundary line which is connected to the first boundary line, is inclined at the third oblique angle with respect to the first direction and extends to the reference line to form the one side boundary, and a fourth boundary line which is connected to the second boundary line, is inclined at the fourth oblique angle with respect to the first direction and extends to the reference line to form the other side boundary opposite to the one side boundary.

24. The liquid crystal display device of claim 23, wherein a length of the third boundary line is shorter than a length of the fourth boundary line.

25. The liquid crystal display device of claim 24, wherein the absolute value of the second oblique angle, an absolute value of the third oblique angle and an absolute value of the fourth oblique angle are substantially the same.

26. The liquid crystal display device of claim 24, wherein an absolute value of the third oblique angle is less than the absolute value of the second oblique angle, and the absolute value of the second oblique angle is less than an absolute value of the fourth oblique angle.

27. The liquid crystal display device of claim 26, wherein a connecting line between one end of the first stem portion and the other end of the first central portion has a degree of inclination of substantially 0 degree with respect to the first direction.

28. The liquid crystal display device of claim 17, wherein the first central portion extends from a part of one end of the first stem portion, and the pixel electrode comprises a step which is provided at a boundary between the first central portion and the first stem portion.

29. The liquid crystal display device of claim 28, wherein the first central portion extends from an inside of one end of the first stem portion.

30. The liquid crystal display device of claim 17, further comprising:

a gate line which is disposed on the first substrate and extends in the first direction.

31. The liquid crystal display device of claim 17, wherein the first oblique angle is substantially 85 degrees.

* * * * *